United States Patent
Waxman et al.

(10) Patent No.: US 8,360,892 B2
(45) Date of Patent: Jan. 29, 2013

(54) FLEXIBLY CONFIGURABLE BUTTON PANELS FOR GAMING MACHINES

(75) Inventors: Thomas D. Waxman, Reno, NV (US);
Scott T. Gowin, Reno, NV (US);
Brandon J. Bohling, Reno, NV (US)

(73) Assignee: IGT, Reno, NV (US)

( * ) Notice: Subject to any disclaimer, the term of this patent is extended or adjusted under 35 U.S.C. 154(b) by 0 days.

(21) Appl. No.: 13/282,893

(22) Filed: Oct. 27, 2011

(65) Prior Publication Data
US 2012/0046107 A1 Feb. 23, 2012

Related U.S. Application Data

(63) Continuation of application No. 11/558,853, filed on Nov. 10, 2006, now Pat. No. 8,070,609.

(51) Int. Cl.
*A63F 13/00* (2006.01)
(52) U.S. Cl. .......................................................... 463/46
(58) Field of Classification Search ............. 463/16–20, 463/46, 47
See application file for complete search history.

(56) References Cited

U.S. PATENT DOCUMENTS

| | | | |
|---|---|---|---|
| 4,070,568 A | 1/1978 | Gala | |
| 4,141,614 A | 2/1979 | Piccirillo | |
| 4,658,375 A | 4/1987 | Onogi et al. | |
| 4,856,787 A | 8/1989 | Itkis | |
| 5,393,067 A | 2/1995 | Paulsen | |
| 5,547,192 A | 8/1996 | Ishibashi | |
| 5,655,961 A | 8/1997 | Acres et al. | |
| 5,752,882 A | 5/1998 | Acres | |
| 5,833,538 A | 11/1998 | Weiss | |
| 5,836,817 A * | 11/1998 | Acres et al. | 463/26 |
| 5,877,633 A | 3/1999 | Ng et al. | |
| 6,102,394 A | 8/2000 | Wurz et al. | |
| 6,117,010 A | 9/2000 | Canterbury et al. | |
| 6,139,360 A | 10/2000 | Hayashi et al. | |
| 6,251,014 B1 | 6/2001 | Stockdale et al. | |
| 6,283,858 B1 | 9/2001 | Hayes, Jr. et al. | |

(Continued)

FOREIGN PATENT DOCUMENTS

| | | |
|---|---|---|
| AU | 2005202951 | 2/2006 |
| CA | 2453758 | 7/2004 |

(Continued)

OTHER PUBLICATIONS

U.S. Appl. No. 11/122,344, filed May 4, 2005 for "Ticket Drawing Games Having Escalating Discrete Prize Levels."

(Continued)

*Primary Examiner* — David L Lewis
*Assistant Examiner* — Eric M Thomas
(74) *Attorney, Agent, or Firm* — Weaver Austin Villeneuve & Sampson LLP

(57) ABSTRACT

Flexibly configurable button panels for electronic devices and dynamic display systems for wager based gaming machines are disclosed. Button panels include a flexible cable, surface mount or other cable connectors spaced along and coupled thereto, and button assemblies coupled thereto via the cable connectors to provide electrical access from buttons to circuit lines. Relative physical locations of buttons are then reconfigurable to form different button panel configurations while the buttons remain coupled to the flexible cable. A dedicated dynamic button panel controller for processing button functions and a button panel identification device having an identification code can also be provided. Buttons can be removably coupled to the cable connectors, and can also include dynamic displays thereupon. Other gaming machine dynamic displays can also be provided. Separate dynamic display controllers can be provided to control dynamic displays directly to alleviate processing burdens on the master gaming controller.

20 Claims, 11 Drawing Sheets

U.S. PATENT DOCUMENTS

| | | | |
|---|---|---|---|
| 6,393,165 B1 | 5/2002 | Yeh | |
| 6,394,900 B1 | 5/2002 | McGlone et al. | |
| 6,443,839 B2 | 9/2002 | Stockdale et al. | |
| 6,454,649 B1 | 9/2002 | Mattice et al. | |
| 6,488,585 B1 | 12/2002 | Wells et al. | |
| 6,503,147 B1 | 1/2003 | Stockdale et al. | |
| 6,514,145 B1 | 2/2003 | Kawabata et al. | |
| 6,569,013 B1 | 5/2003 | Taylor | |
| 6,572,475 B1 | 6/2003 | Okabe et al. | |
| 6,575,832 B1 | 6/2003 | Manfredi et al. | |
| 6,597,197 B1 | 7/2003 | Mosley et al. | |
| 6,628,939 B2 | 9/2003 | Paulsen | |
| 6,629,184 B1 * | 9/2003 | Berg et al. | 710/306 |
| 6,652,378 B2 | 11/2003 | Cannon et al. | |
| 6,663,487 B1 | 12/2003 | Ladner | |
| 6,676,510 B1 | 1/2004 | Bittman et al. | |
| 6,688,981 B2 | 2/2004 | Shigeno | |
| 6,695,696 B1 | 2/2004 | Kaminkow | |
| 6,798,359 B1 | 9/2004 | Ivancic | |
| 6,811,486 B1 | 11/2004 | Luciano, Jr. | |
| 6,846,238 B2 | 1/2005 | Wells | |
| 6,855,054 B2 | 2/2005 | White et al. | |
| 6,866,581 B2 | 3/2005 | Martinek et al. | |
| 6,878,063 B2 | 4/2005 | Manfredi et al. | |
| 6,890,254 B2 | 5/2005 | Kaminkow | |
| 6,899,627 B2 | 5/2005 | Lam et al. | |
| 6,910,962 B2 | 6/2005 | Marks et al. | |
| 6,935,946 B2 | 8/2005 | Yoseloff et al. | |
| 6,979,266 B2 | 12/2005 | LeMay et al. | |
| 6,994,626 B1 | 2/2006 | D'Achard Van Enschut | |
| 7,047,338 B1 | 5/2006 | Nguyen et al. | |
| 7,048,630 B2 | 5/2006 | Berg et al. | |
| 7,063,617 B2 | 6/2006 | Brosnan et al. | |
| 7,071,845 B2 | 7/2006 | Ivancic | |
| 7,804,037 B2 | 9/2010 | Cove | |
| 8,070,609 B2 | 12/2011 | Waxman et al. | |
| 2002/0010014 A1 | 1/2002 | Parra et al. | |
| 2002/0045474 A1 | 4/2002 | Singer et al. | |
| 2002/0052230 A1 | 5/2002 | Martinek et al. | |
| 2002/0077168 A1 | 6/2002 | Jones et al. | |
| 2002/0107059 A1 | 8/2002 | Katayama | |
| 2002/0142825 A1 | 10/2002 | Lark et al. | |
| 2002/0142846 A1 | 10/2002 | Paulsen | |
| 2002/0151360 A1 | 10/2002 | Durham | |
| 2002/0183105 A1 | 12/2002 | Cannon et al. | |
| 2003/0054868 A1 | 3/2003 | Paulsen | |
| 2003/0073490 A1 | 4/2003 | Hecht et al. | |
| 2003/0083132 A1 | 5/2003 | Berg | |
| 2003/0148812 A1 | 8/2003 | Paulsen | |
| 2003/0191809 A1 | 10/2003 | Mosley et al. | |
| 2003/0199295 A1 | 10/2003 | Vancura | |
| 2004/0018877 A1 | 1/2004 | Tastad et al. | |
| 2004/0023709 A1 | 2/2004 | Beaulieu et al. | |
| 2004/0048650 A1 | 3/2004 | Mierau et al. | |
| 2004/0054840 A1 * | 3/2004 | Berg et al. | 710/306 |
| 2004/0054952 A1 | 3/2004 | Morrow et al. | |
| 2004/0106446 A1 | 6/2004 | Cannon et al. | |
| 2004/0137987 A1 | 7/2004 | Nguyen et al. | |
| 2004/0209683 A1 | 10/2004 | Okada | |
| 2005/0020348 A1 * | 1/2005 | Thomas et al. | 463/20 |
| 2005/0037837 A1 | 2/2005 | Rowe | |
| 2005/0043089 A1 | 2/2005 | Nguyen et al. | |
| 2005/0043090 A1 | 2/2005 | Pryzby et al. | |
| 2005/0049037 A1 | 3/2005 | Anderson et al. | |
| 2005/0054441 A1 | 3/2005 | Landrum et al. | |
| 2005/0059458 A1 | 3/2005 | Griswold et al. | |
| 2005/0059485 A1 | 3/2005 | Paulsen et al. | |
| 2005/0101383 A1 | 5/2005 | Wells | |
| 2005/0113163 A1 | 5/2005 | Mattice et al. | |
| 2005/0130728 A1 | 6/2005 | Nguyen et al. | |
| 2005/0130731 A1 | 6/2005 | Englman et al. | |
| 2005/0130737 A1 | 6/2005 | Englman et al. | |
| 2005/0143169 A1 | 6/2005 | Nguyen et al. | |
| 2005/0148384 A1 | 7/2005 | Marks et al. | |
| 2005/0150753 A1 | 7/2005 | Hau | |
| 2005/0187011 A1 | 8/2005 | Kaminkow | |
| 2005/0192081 A1 | 9/2005 | Marks et al. | |
| 2005/0239542 A1 | 10/2005 | Olsen | |
| 2005/0243046 A1 | 11/2005 | Hong | |
| 2005/0288096 A1 | 12/2005 | Walker et al. | |
| 2006/0009285 A1 | 1/2006 | Pryzby et al. | |
| 2006/0019746 A1 | 1/2006 | Seelig et al. | |
| 2006/0030412 A1 | 2/2006 | Cole | |
| 2006/0035696 A1 | 2/2006 | Walker et al. | |
| 2006/0035707 A1 | 2/2006 | Nguyen et al. | |
| 2006/0046830 A1 | 3/2006 | Webb | |
| 2006/0063584 A1 | 3/2006 | Brill et al. | |
| 2006/0068875 A1 | 3/2006 | Cregan et al. | |
| 2006/0068909 A1 | 3/2006 | Pryzby et al. | |
| 2006/0073900 A1 | 4/2006 | Cole | |
| 2006/0111171 A1 | 5/2006 | Berg et al. | |
| 2006/0111186 A1 | 5/2006 | Hattori | |
| 2006/0208764 A1 | 9/2006 | Puar et al. | |
| 2007/0060352 A1 | 3/2007 | Cole | |
| 2008/0073190 A1 | 3/2008 | Cove | |
| 2008/0076506 A1 | 3/2008 | Nguyen et al. | |
| 2008/0113737 A1 | 5/2008 | Waxman | |
| 2008/0113766 A1 | 5/2008 | Waxman et al. | |
| 2009/0131168 A1 | 5/2009 | Waxman et al. | |

FOREIGN PATENT DOCUMENTS

| | | |
|---|---|---|
| DE | 7511873 | 9/1978 |
| DE | 102007001703 | 8/2007 |
| EP | 1453022 | 9/2004 |
| EP | 1571618 | 9/2005 |
| EP | 2084683 | 8/2009 |
| EP | 2089864 | 8/2009 |
| GB | 2403429 | 1/2005 |
| WO | WO 01/88724 | 11/2001 |
| WO | WO 2008/060962 | 5/2008 |
| WO | WO 2008/061009 | 5/2008 |
| WO | WO 2010/053631 | 5/2010 |

OTHER PUBLICATIONS

US Office Action dated Sep. 3, 2010, U.S. Appl. No. 11/558,853.
US Final Office Action dated Feb. 4, 2011, U.S. Appl. No. 11/558,853.
US Notice of Allowance dated Aug. 9, 2011, U.S. Appl. No. 11/558,853.
US Office Action dated Sep. 3, 2010, U.S. Appl. No. 11/558,860.
US Final Office Action dated Apr. 1, 2011, U.S. Appl. No. 11/558,860.
US Office Action dated Sep. 9, 2011, U.S. Appl. No. 12/291,501.
European Examination Report dated Oct. 29, 2009 issued in EP Application No. 07 864 156.0-1238.
Summons to Attend Oral Proceedings dated Apr. 8, 2010, issued in EP Application No. 07 864 209.7-2221.
European Examination Report dated Oct. 20, 2009 issued in EP Application No. 07 864 209.7-2221.
PCT International Search Report and Written Opinion dated Apr. 25, 2008 issued in PCT/US2007/084172.
PCT International Preliminary Report on Patentability dated May 12, 2009 issued in PCT/US2007/084172 (WO 2008/060962).
PCT International Search Report and Written Opinion dated May 8, 2008, issued in PCT/US2007/084271.
PCT International Preliminary Report on Patentability dated May 12, 2009 issued in PCT/US2007/084271 (WO 2008/061009).
PCT Invitation to Pay Fees and Partial Search dated Dec. 10, 2009 issued in PCT/US2009/058249.
PCT International Search Report and Written Opinion dated May 25, 2010 issued in PCT/US2009/058249 (WO 2010/053631).
PCT International Preliminary Report on Patentability dated May 19, 2011 issued in PCT/US2009/058249 (WO 2010/053631).
"Preliminary Specification Product Name: RGC11096096YW000 Product No. 9918201000," RITEK Group RiTdisplay Corporation, Feb. 12, 2007 [online] http://www.ritdisplay.com.
US Office Action dated Nov. 14, 2011, U.S. Appl. No. 11/558,860.
US Final Office Action dated Apr. 27, 2012, U.S. Appl. No. 11/558,860.
US Office Action dated Feb. 28, 2012, U.S. Appl. No. 12/291,501.

* cited by examiner

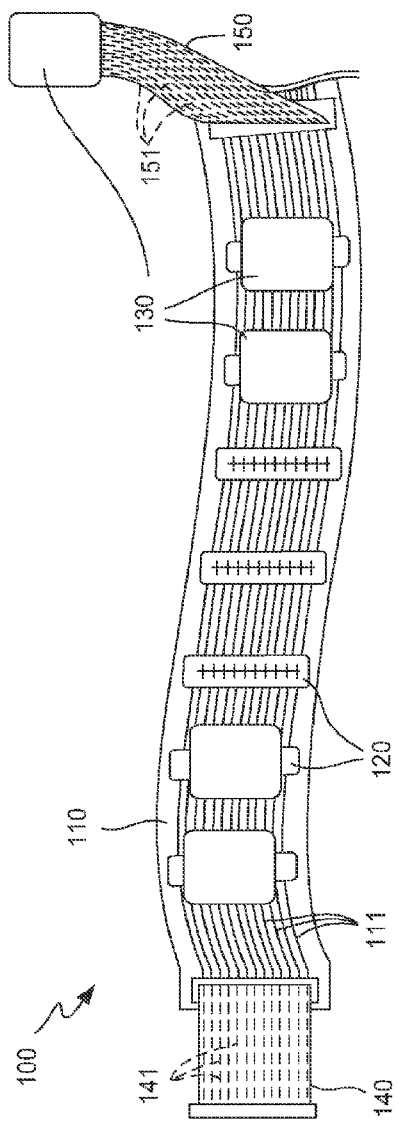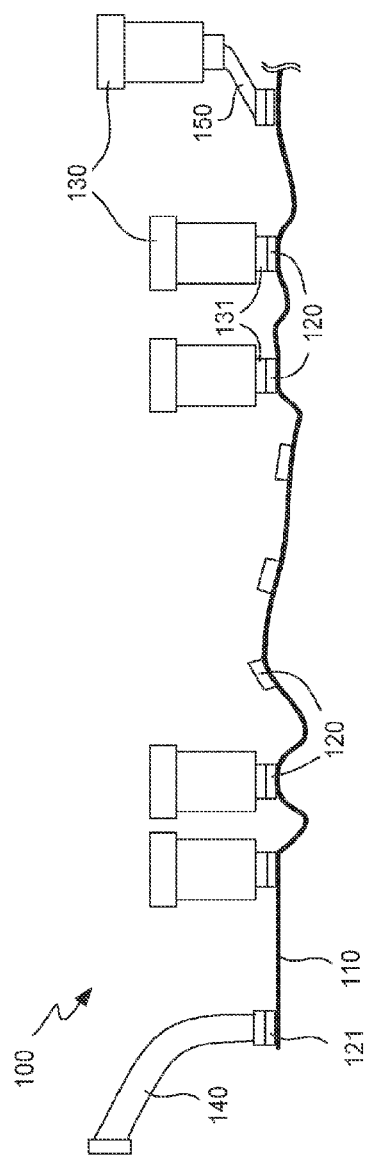

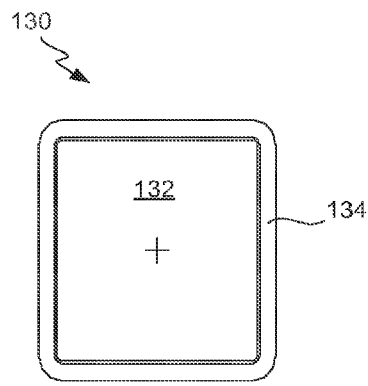
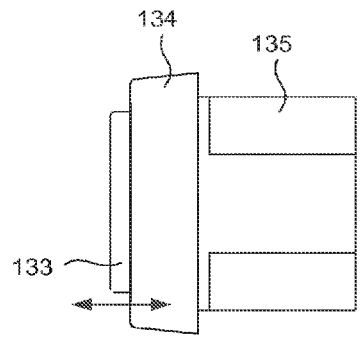
FIG. 5A          FIG. 5B
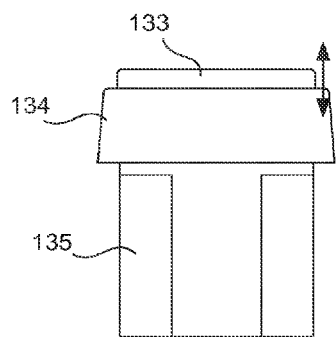
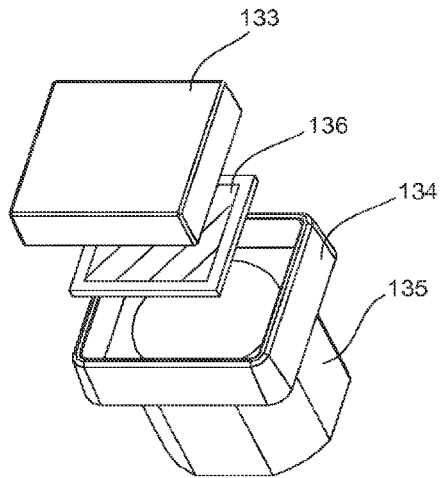
FIG. 5C          FIG. 5D

FLEXIBLY CONFIGURABLE BUTTON PANELS FOR GAMING MACHINES

CROSS-REFERENCE TO RELATED APPLICATION

This application is a continuation of and claims priority to co-pending U.S. patent application Ser. No. 11/558,853, entitled "FLEXIBLY CONFIGURABLE BUTTON PANELS FOR GAMING MACHINES" filed Nov. 10, 2006, now U.S. Pat. No. 8,070,609, issued Dec. 6, 2011, which is incorporated herein by reference in its entirety and for all purposes.

The present application is related to co-pending and commonly owned U.S. patent application Ser. No. 11/558,860, entitled "DYNAMIC DISPLAY SYSTEMS FOR GAMING MACHINES," filed Nov. 10, 2006, which is incorporated by reference herein in its entirety and for all purposes.

TECHNICAL FIELD

The present invention relates generally to electronic machine design and manufacture, and more specifically to the configuration and control of input devices and displays on such electronic machines, particularly gaming machines.

BACKGROUND

Electronic devices and machines have become an everyday part of life in modern times, as even many traditionally non-electronic items and machines have now gone "high-tech." While machines such as coin-operated video games, ticket purchasing machines and other types of vending machines have long been electronic, items such as automobiles, washing machines, coffee makers and other appliances now tend to be electronic as well. Many of these electronic machines and items include various input, output and/or functional result devices and components, such that the overall design, manufacture, use and repair of such electronic machines has become increasingly complex.

Casinos and other forms of gaming are a particular example of an industry where electronic machines, such as, for example, microprocessor based gaming machines, are extremely popular. In a typical electronic gaming machine, such as a slot machine, video poker machine, video keno machine or the like, a game play is first initiated through a player wager of money or credit, whereupon the gaming machine determines a game outcome, presents the game outcome to the player and then potentially dispenses an award of some type, including a monetary award, depending upon the game outcome. Electronic and microprocessor based gaming machines can include a variety of hardware and software components to provide a wide variety of game types and game playing capabilities, with such hardware and software components being generally well known in the art. A typical electronic gaming machine can include hardware devices and peripheral such as bill validators, coin acceptors, card readers, keypads, buttons, levers, touch screens, coin hoppers, player tracking units and the like. In addition, each gaming machine can have various audio and visual display components that can include, for example, speakers, display panels, belly and top glasses, exterior cabinet artwork, lights, and top box dioramas, as well as any number of video displays of various types to show game play and other assorted information, with such video display types including, for example, a cathode ray tube ("CRT"), a liquid crystal display ("LCD"), a light emitting diode ("LED"), a flat panel display and a plasma display, among others.

As noted above, the design and manufacture of such gaming machines and other electronic machines has become increasingly complex, particularly with the advent of multiple displays, sound output devices, touchscreens, buttons, currency acceptors, card acceptors and an assortment of other peripheral devices that may be part of such machines. One type of item that can be found on many such machines is a "button panel" having a plurality of input buttons that are arranged or configured in a particular fashion for a user of the machine. As is generally known, buttons for such button panels tend to be relatively large and spaced apart from each other in a fashion that is distinctive from smaller keypad types of buttons and arrangements. In particular, such button panels can be found, for example, on coin-operated video games, video poker machines, video keno machines, electronic slot machines, and the like. One example of a generally well-known button panel could be the arrangement of buttons that typically exist on a video poker machine, the button panel for which can include one hold/drop button for each video poker card, a deal/draw button, a repeat bet button, one or more other betting buttons, a cash out button, and/or a service button, among others. While the entire collection of these buttons on the front panel of the video poker machine can be generally be referred to as the "button panel" for that machine, such a button panel might also include one or more other buttons located elsewhere about the machine, or could be a subset of all of the buttons on the front panel of the machine, as may be desired.

While button panels such as the general video poker button panel as noted above can be the same or substantially similar on the same type of machines, the numbers and configurations of such buttons can differ substantially between different models and types of machines. For example, while one slot machine or video game might have six rectangular buttons arranged in a line on a front button panel, the next slot machine or video game might have seven circular buttons arranged or configured in a more artful fashion on an otherwise similar front button panel. Because the numbers and configurations of such button panels can vary widely from one machine type or model to another, it is typical for each of such differing types and models of machine to be designed and manufactured in a customized manner. That is, every different model of gaming machine or other similar electronic device having a button panel typically requires that a separate assessment be made of the buttons, wiring and other parts needed to construct its particular button panel.

As is generally known, such button panels for gaming machines and other similar devices are typically made with customized wiring that runs from each button to another button and/or to one or more processing devices adapted to process input from the various buttons. While such wiring can be organized in various ways, such as through the use of harnesses and/or coupling devices so as to streamline the manufacturing and/or repair processes, it is typically incumbent upon those making the machine to individually connect and solder the endpoints of each wire. This can tend to be a labor intensive process, requiring the expenditure of significant amounts of time and resources to simply wire each button individually. Such customized wiring of buttons individually for each machine can lead to additional problems whenever a mistake is made in the wiring process, the detection and resolution of which can also be costly and time consuming. Furthermore, the repair or switching out of buttons or other defective components can also be costly and time consuming processes where such buttons have been individually wired in a customized manner.

Various attempts have been made to provide improved button panels, details of which may be found, for example, in U.S. Pat. Nos. 6,102,394 and 6,117,010, as well as U.S. Patent Publication No. 2004/0018877, which references are each incorporated herein by reference. While the various features of these references may provide some benefits regarding button panels, there still remain a variety of drawbacks. For example, the overall configurable and reconfigurable nature of these button panels is not as flexible as may be desired for some manufacturing and repair situations. Furthermore, it does not appear that these button panels have any particularized identifying features, nor are there any specialized processing components or arrangements associated with these button panels, such as to identify missing, malfunctioning or wrongly configured buttons on the button panel.

While existing designs and systems for providing button panels in electronic devices and machines have been adequate in the past, improvements are usually welcomed and encouraged. In light of the foregoing, it is thus desirable to develop a more universal and flexible button panel that is adapted to be used in different models of machines, such that the manufacture, use and repair of such a button panel would be streamlined significantly.

Regarding such a more universal and flexible button panel, it is generally known that sophisticated buttons now exist having small display screens thereupon. For example, U.S. Pat. Nos. 6,798,359, and 7,071,845, which are each incorporated herein by reference, both teach of buttons having 16×16 pixel LCD screens disposed thereupon. While these particular buttons are used within the context of a keypad, it is generally known that such uses may extend to non-keypad type buttons and button panels. However, the use of such display embedded buttons within wager based gaming machines can present additional problems unique to gaming machines.

As is generally known, electronic wager based gaming machines typically include a master gaming controller ("MGC") that is responsible for many or all primary gaming machine functions, particularly all random number generator and game determination outcomes, outcome displays, monetary and ticket intake, payouts, user input processing, and various security functions. In addition, the burden for processing many other gaming machine functions tend to be placed on the MGC, with such other functions typically including video and display processing. With the advent of secondary, tertiary and further displays, however, as well as more sophisticated animations, displays and video, the display processing burdens alone that can now be placed on the MGC have become immense. Adding further displays for a plurality of buttons, along with the accompanying processing needs, can only serve to aggravate this existing problem.

Accordingly, while existing gaming machine architectures and designs for providing multiple display processing have been adequate in the past, improvements are usually welcomed and encouraged. In light of the foregoing, it is thus desirable to develop a more dynamic display system that is adapted to be used in sophisticated gaming machines having multiple displays, such that the burdens and drawbacks of relying upon a master gaming controller to do all or much of the display processing for the entire gaming machine can be significantly reduced.

SUMMARY

It is an advantage of the present invention to provide button panels for electronic devices that are more universal, interchangeable and flexibly configurable, such that the manufacture, use and repair of such button panels are streamlined significantly. This can be accomplished at least in part through the use of a flexible cable, such as a flat printed flex circuit, which can be used to physically and electrically connect a plurality of subject buttons together in parallel into a single button panel strip that is more efficient for use within the overall electronic device. It is an additional advantage of the present invention to provide more dynamic display systems and methods for use within a gaming machine, such that the display processing burdens placed upon a master gaming controller are alleviated.

In many embodiments, the subject flexibly configurable button panel is adapted to provide a plurality of input buttons that can be arranged into multiple distinct button panel configurations for an associated electronic device. Such a flexibly configurable button panel can include a flexible cable having a plurality of separate circuit lines running therethrough, a plurality of cable connectors spaced along and coupled to the flexible cable, and a plurality of button assemblies coupled to the flexible cable via one or more of the plurality of cable connectors, which cable connectors can be surface mount connectors, through-hole connectors, press-fit connectors or any other suitable cable connectors. Each cable connector can be adapted to provide electrical access to at least a portion of the plurality of separate circuit lines such that each button assembly coupled to a cable connector is also provided such electrical access. One beneficial resulting feature for such a flexibly configurable button panel is that the relative physical locations of the button assemblies (and thus the buttons) with respect to each other are substantially reconfigurable to form different button panel configurations while those button assemblies remain coupled to the flexible cable via the respective cable connectors.

Further features and items may also be found in various embodiments, and it will be readily appreciated that various combinations of the following features and items may be used as may be desired. For example, in some embodiments the flexible cable can comprise a flat flex circuit having printed circuit lines. In some embodiments, at least one of the button assemblies can be removably coupled to its respective cable connector. In some embodiments, the spacing between multiple pairs of or even all consecutive cable connectors along said flexible cable can be greater than about one inch. In some embodiments, at least one cable connector can be adapted to provide electrical access to every active circuit line within the flexible cable, such as for purposes of communication with one or more processors external to the flexibly configurable button panel. In some embodiments, the circuit lines within the flexible cable can include data, programming, clock, strobe, power, ground and address lines. In some instances, the plurality of button assemblies can include at least five button assemblies, ten button assemblies, or even 32 button assemblies or more. Further, one or more of the button assemblies can comprise an input button having a small video screen or other visual display screen thereupon. In some embodiments, at least one electrical harness coupling a respective button assembly to a respective cable connector can also be provided, such that the respective button assembly is thereby flexibly locatable with respect to the flexible cable.

One or more added components can also be a part of and/or closely associated with such flexibly configurable button panels. Such added components can include a dedicated dynamic button panel controller that is coupled to the flexible cable via a respective cable connector, with such a dedicated dynamic button panel controller being adapted to process input from each button assembly. A button panel identification ("ID") device can also be included, with such a button panel ID device having a specifically assigned identification number or code that corresponds to a particular callout of button assemblies that should be present at specific cable connectors that are on the flexible cable. In some embodiments, a set of switches, such as, for example, manually settable dual inline package ("DIP") switches can be provided, where the button panel identification number or code is a result of the setting of the DIP switches or other suitable switches. In some embodiments, an electronic identification chip or storage device can be provided, where the specific button panel identification number or code is provided as a result of a number or code stored on the electronic identification chip or storage device. In some embodiments, at least one of the dedicated dynamic button panel controller and/or the button panel ID device can be adapted to check each of the cable connectors for the appropriate presence or absence of a button assembly according to the specifically assigned button panel identification number or code.

In some embodiments, which may include any combination of the foregoing items and features, a mounting support plate or other suitable cover plate can be included as part of a flexibly configurable button panel or electronic device having such a button panel. Such a mounting support plate can be formed from a rigid material and have holes for buttons disposed therethrough, such that the various button assemblies of the button panel can be located through the holes and mounted to or with respect to the mounting support plate or cover plate.

In any of the foregoing embodiments, such a flexibly configurable button panel can be incorporated into an overall electronic device, such as a ticket purchase machine, coin-operated video game, gaming machine, and the like. In particular, various embodiments include a gaming machine having a flexibly configurable button panel such as those described herein. Such a gaming machine can be adapted to host wager based games involving accepting a wager, playing a game based on the wager and granting a payout based on the result of the game. In addition to the flexibly configurable button panel, such a gaming machine can also include an exterior housing arranged to contain a plurality of internal gaming machine components therein, as well as a master gaming controller that is in communication with the flexibly configurable button panel and at least one other of the internal gaming machine components, and that is adapted to execute or control one or more aspects of a wager based game. Further embodiments can involve such a gaming machine within an overall gaming system that can include multiple gaming machines and other electronic devices, one or more of which may also include a flexibly configurable button panel.

In further embodiments, various methods of manufacturing, using and/or repairing an electronic device having user input buttons may also be provided. For example, a manufacturing process can involve selecting a flexibly configurable button panel such as any of those described above, electrically coupling this flexibly configurable button panel to a processing unit associated with the overall electronic device, and arranging the relative physical locations of the associated plurality of button assemblies with respect to each other to form a specific button panel configuration while such button assemblies remain coupled to the respective flexible cable via their respective cable connectors. While the processing unit is preferably adapted to process input from the plurality of button assemblies, the specific configuration formed can be in accordance with a pre-designed button panel configuration for the electronic device. An additional process step can involve checking whether the button assemblies used are correctly located at their respective plurality of cable connectors in accordance with the pre-designed button panel configuration. As noted above, such a checking step can be performed in accordance with a number or code present on a button panel identification device associated with the flexibly configurable button panel, and may be automated.

In still further embodiments, various systems and methods involving a dynamic display system for a gaming machine are provided. As noted above, such a gaming machine can be adapted for hosting wager based games, and can include an exterior housing and a master gaming controller adapted to execute or control one or more aspects of the wager based games. The gaming machine can also include a primary display in communication with the master gaming controller and adapted to present one or more components of said wager based game, a plurality of dynamic displays located on or about the gaming machine and separate from the primary display, and one or more dynamic display controllers located separately from the master gaming controller and adapted to control directly the displays of the plurality of dynamic displays. Such dynamic display controllers can also be in direct or indirect communication with the master gaming controller, such as to receive actual downloaded content, high level commands that require additional detailed display processing by the dynamic display controllers, or both.

In various detailed embodiments of the foregoing general gaming machine having a dynamic display system, one or more of the following features and items can be used in any combination deemed desirable. In some embodiments, the dynamic displays can include five, ten, 32, or more dynamic displays, which dynamic displays can be located on distinctly separate gaming machine components. Such distinctly separate gaming machine components can include a top box display, a belly glass display, a dynamic button panel, a dynamic button, a bonus device display and a player tracking display, among others. In some embodiments, a dynamic display can be adapted to display default images, diagnostic images, or both, while in some embodiments at least one dynamic display controllers can be built into a respective dynamic display, such as one that it controls.

In some embodiments, a dynamic display controller can be adapted to store static visual images, video, or both for use with its controlled dynamic display or displays, while in some embodiments a dynamic display controllers can be adapted to receive directly downloaded static visual images, video, or both from an outside source, such as a master gaming controller, an external server, or both. In various embodiments, a dynamic display controller can be adapted to control different types of dynamic displays simultaneously, and in such cases such a dynamic display controller can be further adapted to detect and diagnose the types of dynamic displays with which it communicates. Furthermore, as noted above, such gaming machines having a dynamic display system can also include a flexibly configurable button panel such as any of the button panels disclosed herein. In particular, such button panels may include buttons having displays disposed thereupon, such that one or more dynamic display controllers can be used to control such button displays.

Other methods, features and advantages of the invention will be or will become apparent to one with skill in the art upon examination of the following figures and detailed description. It is intended that all such additional methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and process steps for the disclosed inventive flexibly configurable button panels and methods of manufacture therefor.

FIG. 3A illustrates in top plan view an exemplary section of a flexibly configurable button panel having multiple buttons coupled thereto according to one embodiment of the present invention.

FIG. 3B illustrates in side elevation view the exemplary section of a flexibly configurable button panel of FIG. 3A.

FIGS. 5A through 5D illustrate in top, side, front and partially exploded perspective views an exemplary button assembly according to one embodiment of the present invention.

DETAILED DESCRIPTION

Figure 1:
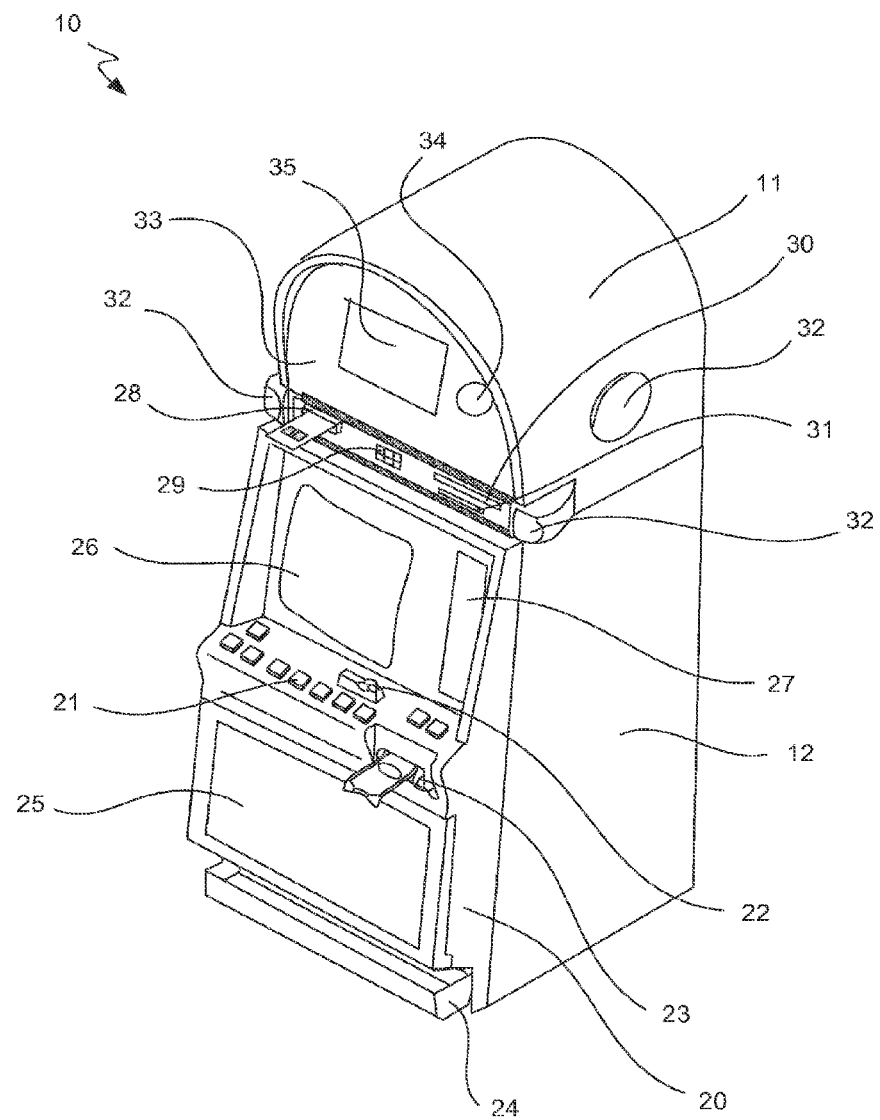
FIG. 1 illustrates in perspective view an exemplary gaming machine.

Exemplary applications of methods and systems according to the present invention are described as follows. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as definitive or limiting in scope or setting. Although these examples are described in sufficient detail to enable one skilled in the art to practice the invention, it will be understood that they are not limiting, such that other embodiments may be used and changes may be made without departing from the spirit and scope of the invention.

The flexibly configurable button panels and associated components disclosed herein provide numerous advantages, such that the manufacture, use and repair of such button panels are significantly enhanced. Advantages include reduced costs and times involved with the initial manufacture of host electronic devices, such as gaming machines, as well as substantial increases in the flexibility of configuring and reconfiguring the relative physical locations of buttons within a given button panel. Added advantages can include the easier switch out of broken buttons and wholesale replacement of button assemblies, as well as the ability to set and identify different button panel configurations through the use of button panel ID codes and the hard coding of individual button addresses along the associated flexible cable. Such abilities can lead to a greater interchangeability and multiplied uses of parts for all types of buttons and gaming machines, such that added benefits to part and inventory buying and tracking in the manufacturing process may also be achieved.

It is to be understood that use of the term "button panel" throughout the present application generally refers to a collection or group of associated buttons, button assemblies, switches and/or other related components, as may be applicable. Other than the actual buttons themselves, it is not to be assumed that any other part or component shall be required as part of any given "button panel" without specific description to the contrary. Thus, while components such as a flexible cable, cable connector, button display, button processor, panel ID, mounting support plate and other items may be components of various button panels, it is not required that any given button panel must contain any or all of these components unless otherwise stated or claimed. For example, one particular flexibly configurable button panel, as described below and later claimed herein, can simply include a flexible cable, a plurality of cable connectors, and a plurality of button assemblies, with no processor, mounting support plate or other component being included.

Although the majority of the present application focuses on the use of button panels within a wager based gaming machine as illustrative examples, it will be readily understood that the subject flexibly configurable button panels can similarly be used in a variety of other electronic devices, such as coin-operated video games, vending machines, ticket purchase machines, and other similar devices having input buttons that are spaced apart in non-keypad type arrangements. Accordingly, it is to be understood that the various flexibly configurable button panels disclosed herein are not restricted to gaming machine applications in all instances. Continuing with the example of gaming machines solely for illustrative purposes within this application, various gaming machines and gaming systems will be presented next, followed by specific details regarding the subject flexibly configurable button panels. Various applications with respect to a dynamic display system within a gaming machine are then provided, followed by an exemplary method of manufacture.

Gaming Machines

Referring first to FIG. 1, an exemplary gaming machine is illustrated in perspective view. Gaming machine 10 includes a top box 11 and a main cabinet 12, which generally surrounds the machine interior (not shown) and is viewable by users. This top box and/or main cabinet can together or separately form an exterior housing adapted to contain a plurality of internal gaming machine components therein. Main cabinet 12 includes a main door 20 on the front of the gaming machine, which preferably opens to provide access to the gaming machine interior. Attached to the main door are typically one or more player-input switches or buttons 21, which collectively form a button panel, one or more money or credit acceptors, such as a coin acceptor 22 and a bill or ticket validator 23, a coin tray 24, and a belly glass 25. Viewable through main door 20 is a primary video display monitor 26 adapted to present a game and one or more information panels 27. The primary video display monitor 26 will typically be a cathode ray tube, high resolution flat-panel LCD, plasma/LED display or other conventional or other type of appropriate video monitor. Alternatively, a plurality of gaming reels can be used as a primary gaming machine display in place of display monitor 26, with such gaming reels preferably being electronically controlled, as will be readily appreciated by one skilled in the art.

Top box 11, which typically rests atop of the main cabinet 12, may contain a ticket dispenser 28, a key pad 29, one or more additional displays 30, a card reader 31, one or more speakers 32, a top glass 33, one or more cameras 34, and a secondary video display monitor 35, which can similarly be a cathode ray tube, a high resolution flat-panel LCD, a plasma/LED display or any other conventional or other type of appropriate video monitor. Alternatively, secondary display monitor 35 might also be foregone in place of other displays, such as gaming reels or physical dioramas that might include other moving components, such as, for example, one or more movable dice, a spinning wheel or a rotating display. It will be understood that many makes, models, types and varieties of gaming machines exist, that not every such gaming machine will include all or any of the foregoing items, and that many gaming machines will include other items not described above.

With respect to the basic gaming abilities provided, it will be readily understood that gaming machine 10 can be adapted for presenting and playing any of a number of gaming events, particularly games of chance involving a player wager and potential monetary payout, such as, for example, a wager on a sporting event or general play as a slot machine game, a keno game, a video poker game, a video blackjack game, and/or any other video table game, among others. Other features and functions may also be used in association with gaming machine 10, and it is specifically contemplated that the present invention can be used in conjunction with such a gaming machine or device that might encompass any or all such additional types of features and functions.

With respect to electronic gaming machines in particular, the electronic gaming machines made by IGT are provided with special features and additional circuitry that differentiate them from general-purpose computers, such as a laptop or desktop personal computer ("PC"). Because gaming machines are highly regulated to ensure fairness, and in many cases are operable to dispense monetary awards of millions of dollars, hardware and software architectures that differ significantly from those of general-purpose computers may be implemented into a typical electronic gaming machine in order to satisfy security concerns and the many strict regulatory requirements that apply to a gaming environment. A general description of many such specializations in electronic gaming machines relative to general-purpose computing machines and specific examples of the additional or different components and features found in such electronic gaming machines will now be provided.

At first glance, one might think that adapting PC technologies to the gaming industry would be a simple proposition, since both PCs and gaming machines employ microprocessors that control a variety of devices. However, because of such reasons as 1) the regulatory requirements that are placed upon gaming machines, 2) the harsh environment in which gaming machines operate, 3) security requirements and 4) fault tolerance requirements, adapting PC technologies to a gaming machine can be quite difficult. Further, techniques and methods for solving a problem in the PC industry, such as device compatibility and connectivity issues, might not be adequate in the gaming environment. For instance, a fault or a weakness tolerated in a PC, such as security holes in software or frequent crashes, may not be tolerated in a gaming machine because in a gaming machine these faults can lead to a direct loss of funds from the gaming machine, such as stolen cash or loss of revenue when the gaming machine is not operating properly.

Accordingly, one difference between gaming machines and common PC based computers or systems is that gaming machines are designed to be state-based systems. In a state-based system, the system stores and maintains its current state in a non-volatile memory, such that in the event of a power failure or other malfunction the gaming machine will return to its current state when the power is restored. For instance, if a player were shown an award for a game of chance and the power failed before the award was provided, the gaming machine, upon the restoration of power, would return to the state where the award was indicated. As anyone who has used a PC knows, PCs are not state machines, and a majority of data is usually lost when a malfunction occurs. This basic requirement affects the software and hardware design of a gaming machine in many ways.

A second important difference between gaming machines and common PC based computer systems is that for regulation purposes, the software on the gaming machine used to generate the game of chance and operate the gaming machine must be designed as static and monolithic to prevent cheating by the operator of gaming machine. For instance, one solution that has been employed in the gaming industry to prevent cheating and satisfy regulatory requirements has been to manufacture a gaming machine that can use a proprietary processor running instructions to generate the game of chance from an EPROM or other form of non-volatile memory. The coding instructions on the EPROM are static (non-changeable) and must be approved by a gaming regulator in a particular jurisdiction and installed in the presence of a person representing the gaming jurisdiction. Any change to any part of the software required to generate the game of chance, such as, for example, adding a new device driver used by the master gaming controller to operate a device during generation of the game of chance, can require a new EPROM to be burnt, approved by the gaming jurisdiction, and reinstalled on the gaming machine in the presence of a gaming regulator. Regardless of whether the EPROM solution is used, to gain approval in most gaming jurisdictions, a gaming machine must demonstrate sufficient safeguards that prevent an operator of the gaming machine from manipulating hardware and software in a manner that gives the operator an unfair or even illegal advantage over a player. The code validation requirements in the gaming industry affect both hardware and software designs on gaming machines.

A third important difference between gaming machines and common PC based computer systems is that the number and kinds of peripheral devices used on a gaming machine are not as great as on PC based computer systems. Traditionally in the gaming industry, gaming machines have been relatively simple in the sense that the number of peripheral devices and the number of functions on the gaming machine have been limited. Further, the functionality of a gaming machine tends to remain relatively constant once the gaming machine is deployed, in that new peripheral devices and new gaming software is infrequently added to an existing operational gaming machine. This differs from a PC, where users tend to buy new and different combinations of devices and software from different manufacturers, and then connect or install these new items to a PC to suit their individual needs. Therefore, the types of devices connected to a PC may vary greatly from user to user depending on their individual requirements, and may also vary significantly over time for a given PC.

Although the variety of devices available for a PC may be greater than on a gaming machine, gaming machines still have unique device requirements that differ from a PC, such as device security requirements not usually addressed by PCs. For instance, monetary devices such as coin dispensers, bill validators, ticket printers and computing devices that are used to govern the input and output of cash to a gaming machine have security requirements that are not typically addressed in PCs. Many PC techniques and methods developed to facilitate device connectivity and device compatibility do not address the emphasis placed on security in the gaming industry. To address some of these issues, a number of hardware/software components and architectures are utilized in gaming machines that are not typically found in general-purpose computing devices, such as PCs. These hardware/software components and architectures include, but are not limited to, items such as watchdog timers, voltage monitoring systems, state-based software architectures and supporting hardware, specialized communication interfaces, security monitoring, and trusted memory.

A watchdog timer is normally used in IGT gaming machines to provide a software failure detection mechanism. In a normal operating system, the operating software periodically accesses control registers in a watchdog timer subsystem to "re-trigger" the watchdog. Should the operating software not access the control registers within a preset timeframe, the watchdog timer will time out and generate a system reset. Typical watchdog timer circuits contain a loadable timeout counter register to allow the operating software to set the timeout interval within a certain time range. A differentiating feature of some preferred circuits is that the operating software cannot completely disable the function of the watchdog timer. In other words, the watchdog timer always functions from the time power is applied to the board.

IGT gaming computer platforms preferably use several power supply voltages to operate portions of the computer circuitry. These can be generated in a central power supply or locally on the computer board. If any of these voltages falls out of the tolerance limits of the circuitry they power, unpredictable operation of the computer may result. Though most modern general-purpose computers include voltage-monitoring circuitry, these types of circuits only report voltage status to the operating software. Out of tolerance voltages can cause software malfunction, creating a potential uncontrolled condition in the gaming computer. IGT gaming machines, however, typically have power supplies with tighter voltage margins than that required by the operating circuitry. In addition, the voltage monitoring circuitry implemented in IGT gaming computers typically has two thresholds of control. The first threshold generates a software event that can be detected by the operating software and an error condition generated. This threshold is triggered when a power supply voltage falls out of the tolerance range of the power supply, but is still within the operating range of the circuitry. The second threshold is set when a power supply voltage falls out of the operating tolerance of the circuitry. In this case, the circuitry generates a reset, halting operation of the computer.

The standard method of operation for IGT gaming machine game software is to use a state machine. Each function of the game (e.g., bet, play, result) is defined as a state. When a game moves from one state to another, critical data regarding the game software is stored in a custom non-volatile memory subsystem. In addition, game history information regarding previous games played, amounts wagered, and so forth also should be stored in a non-volatile memory device. This feature allows the game to recover operation to the current state of play in the event of a malfunction, loss of power, or the like. This is critical to ensure that correct wagers and credits are preserved. Typically, battery backed RAM devices are used to preserve this critical data. These memory devices are not used in typical general-purpose computers. Further, IGT gaming computers normally contain additional interfaces, including serial interfaces, to connect to specific subsystems internal and external to the gaming machine. The serial devices may have electrical interface requirements that differ from the "standard" EIA RS232 serial interfaces provided by general-purpose computers. These interfaces may include EIA RS485, EIA RS422, Fiber Optic Serial, optically coupled serial interfaces, current loop style serial interfaces, and the like. In addition, to conserve serial interfaces internally in the gaming machine, serial devices may be connected in a shared, daisy-chain fashion where multiple peripheral devices are connected to a single serial channel.

IGT gaming machines may alternatively be treated as peripheral devices to a casino communication controller and connected in a shared daisy chain fashion to a single serial interface. In both cases, the peripheral devices are preferably assigned device addresses. If so, the serial controller circuitry must implement a method to generate or detect unique device addresses. General-purpose computer serial ports are not able to do this. In addition, security-monitoring circuits detect intrusion into an IGT gaming machine by monitoring security switches attached to access doors in the gaming machine cabinet. Preferably, access violations result in suspension of game play and can trigger additional security operations to preserve the current state of game play. These circuits also function when power is off by use of a battery backup. In power-off operation, these circuits continue to monitor the access doors of the gaming machine. When power is restored, the gaming machine can determine whether any security violations occurred while power was off, such as by software for reading status registers. This can trigger event log entries and further data authentication operations by the gaming machine software.

Trusted memory devices are preferably included in an IGT gaming machine computer to ensure the authenticity of the software that may be stored on less secure memory subsystems, such as mass storage devices. Trusted memory devices and controlling circuitry are typically designed to not allow modification of the code and data stored in the memory device while the memory device is installed in the gaming machine. The code and data stored in these devices may include, for example, authentication algorithms, random number generators, authentication keys, operating system kernels, and so forth. The purpose of these trusted memory devices is to provide gaming regulatory authorities a root trusted authority within the computing environment of the gaming machine that can be tracked and verified as original. This may be accomplished via removal of the trusted memory device from the gaming machine computer and verification of the secure memory device contents is a separate third party verification device. Once the trusted memory device is verified as authentic, and based on the approval of verification algorithms contained in the trusted device, the gaming machine is allowed to verify the authenticity of additional code and data that may be located in the gaming computer assembly, such as code and data stored on hard disk drives.

Mass storage devices used in a general-purpose computer typically allow code and data to be read from and written to the mass storage device. In a gaming machine environment, modification of the gaming code stored on a mass storage device is strictly controlled and would only be allowed under specific maintenance type events with electronic and physical enablers required. Though this level of security could be provided by software, IGT gaming computers that include mass storage devices preferably include hardware level mass storage data protection circuitry that operates at the circuit level to monitor attempts to modify data on the mass storage device and will generate both software and hardware error triggers should a data modification be attempted without the proper electronic and physical enablers being present. In addition to the basic gaming abilities provided, these and other features and functions serve to differentiate gaming machines into a special class of computing devices separate and distinct from general-purpose computers.

General Gaming Network and System Configurations

Figure 2:
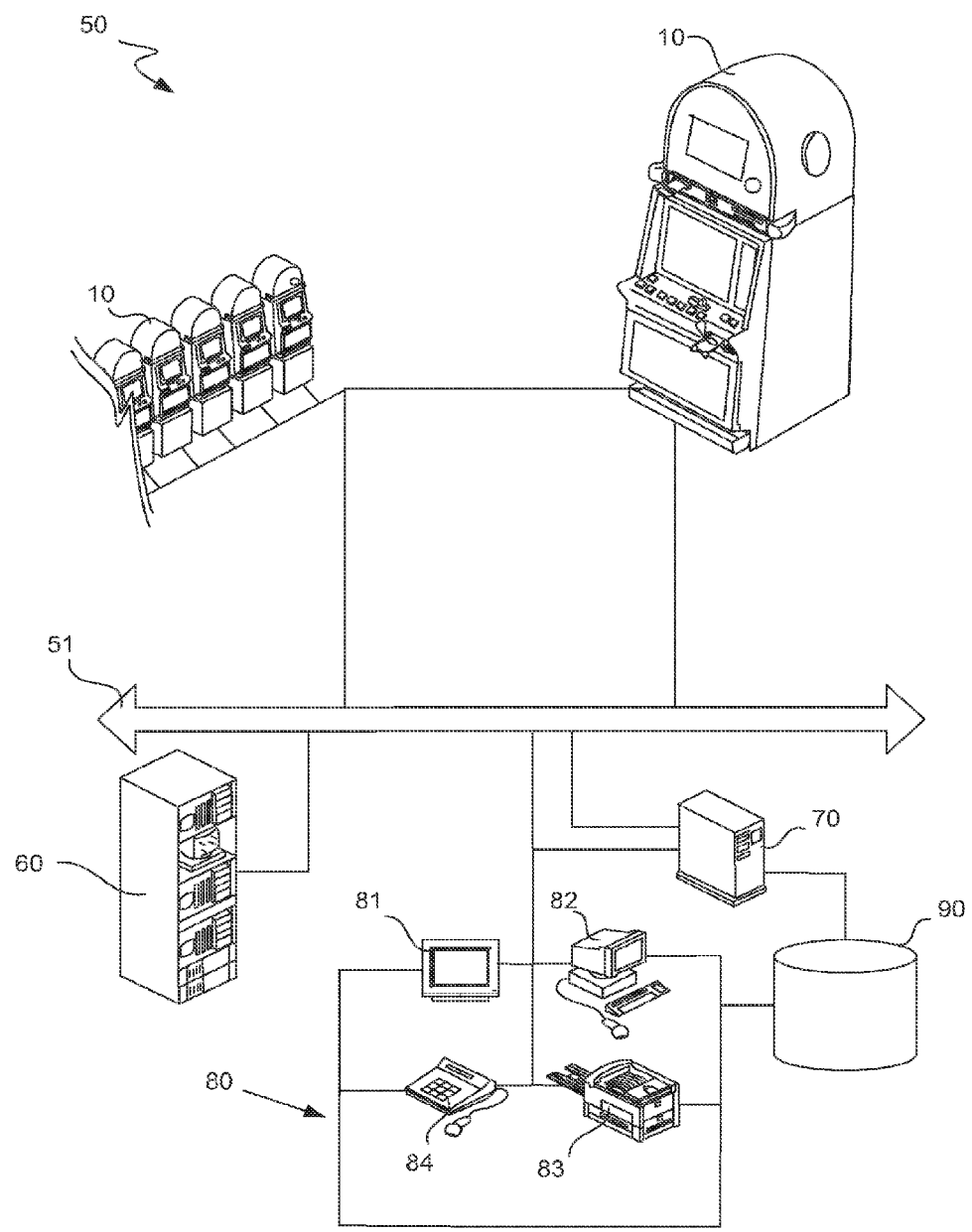
FIG. 2 illustrates in block diagram format an exemplary network infrastructure for providing a gaming system having one or more gaming machines.

Continuing with FIG. 2, an exemplary network infrastructure for providing a gaming system having one or more gaming machines is illustrated in block diagram format. Exemplary gaming system 50 has one or more gaming machines, various communication items, and a number of host-side components and devices adapted for use within a gaming environment. As shown, one or more gaming machines 10 adapted for use in gaming system 50 can be in a plurality of locations, such as in banks on a casino floor or standing alone at a smaller non-gaming establishment, as desired. Common bus 51 can connect one or more gaming machines or devices to a number of networked devices on the gaming system 50, such as, for example, a general-purpose server 60, one or more special-purpose servers 70, a sub-network of peripheral devices 80, and/or a database 90.

A general-purpose server 60 may be one that is already present within a casino or other establishment for one or more other purposes beyond any monitoring or administering involving gaming machines. Functions for such a general-purpose server can include other general and game specific accounting functions, payroll functions, general Internet and e-mail capabilities, switchboard communications, and reservations and other hotel and restaurant operations, as well as other assorted general establishment record keeping and operations. In some cases, specific gaming related functions such as cashless gaming, downloadable gaming, player tracking, remote game administration, video or other data transmission, or other types of functions may also be associated with or performed by such a general-purpose server. For example, such a server may contain various programs related to cashless gaming administration, player tracking operations, specific player account administration, remote game play administration, remote game player verification, remote gaming administration, downloadable gaming administration, and/or visual image or video data storage, transfer and distribution, and may also be linked to one or more gaming machines, in some cases forming a network that includes all or many of the gaming devices and/or machines within the establishment. Communications can then be exchanged from each adapted gaming machine to one or more related programs or modules on the general-purpose server.

In one embodiment, gaming system 50 contains one or more special-purpose servers that can be used for various functions relating to the provision of cashless gaming and gaming machine administration and operation under the present methods and systems. Such a special-purpose server or servers could include, for example, a cashless gaming server, a player verification server, a general game server, a downloadable games server, a specialized accounting server, and/or a visual image or video distribution server, among others. Of course, these functions may all be combined onto a single specialized server. Such additional special-purpose servers are desirable for a variety of reasons, such as, for example, to lessen the burden on an existing general-purpose server or to isolate or wall off some or all gaming machine administration and operations data and functions from the general-purpose server and thereby increase security and limit the possible modes of access to such operations and information.

Alternatively, exemplary gaming system 50 can be isolated from any other network at the establishment, such that a general-purpose server 60 is essentially impractical and unnecessary. Under either embodiment of an isolated or shared network, one or more of the special-purpose servers are preferably connected to sub-network 80, which might be, for example, a cashier station or terminal. Peripheral devices in this sub-network may include, for example, one or more video displays 81, one or more user terminals 82, one or more printers 83, and one or more other input devices 84, such as a ticket validator or other security identifier, among others. Similarly, under either embodiment of an isolated or shared network, at least the specialized server 70 or another similar component within a general-purpose server 60 also preferably includes a connection to a database or other suitable storage medium 90. Database 90 is preferably adapted to store many or all files containing pertinent data or information for a particular purpose, such as, for example, data regarding visual image data, video clips, other displayable items, and/or related data, among other potential items. Files, data and other information on database 90 can be stored for backup purposes, and are preferably accessible at one or more system locations, such as at a general-purpose server 60, a special purpose server 70 and/or a cashier station or other sub-network location 80, as desired.

While gaming system 50 can be a system that is specially designed and created new for use in a casino or gaming establishment, it is also possible that many items in this system can be taken or adopted from an existing gaming system. For example, gaming system 50 could represent an existing cashless gaming system to which one or more of the inventive components or controller arrangements are added, such as controllers, storage media, and/or other components that may be associated with a dynamic display system adapted for use across multiple gaming machines and devices. In addition to new hardware, new functionality via new software, modules, updates or otherwise can be provided to an existing database 90, specialized server 70 and/or general-purpose server 60, as desired. Other modifications to an existing system may also be necessary, as might be readily appreciated.

Flexibly Configurable Button Panels

As noted above, many electronic devices include a "button panel" having a plurality of input buttons that are arranged or configured in a particular fashion for a user of the machine. As is generally known, buttons for such button panels tend to be relatively large and spaced apart from each other in a fashion that is distinctive from smaller keypad types of buttons. As also noted above, such button panels tend to be manufactured through individual wiring and soldering techniques, which tend to involve substantial amounts of skilled labor and increasing messiness as the number of buttons increases. Even in the improved examples set forth in U.S. Pat. Nos. 6,102,394 and 6,117,010, as well as U.S. Patent Publication No. 2004/0018877, as noted above, the levels of flexibility in configuring buttons and ease in manufacture and use of button panels is not fully maximized.

Turning now to FIGS. 3A and 3B, an exemplary section of a flexibly configurable button panel having multiple buttons coupled thereto according to one embodiment of the present invention is illustrated in top plan and side elevation views. Flexibly configurable button panel 100 includes a flexible cable 110 having a plurality circuit lines 111. Although a variety of items can suffice as such a flexible cable having circuit lines, a flat flex circuit having printed circuit lines is thought to work well for this purpose. While such an item could conceivably be an off the shelf model flat flex circuit, it is generally understood in the art that many flat flex circuits are custom designed and manufactured for particular applications. Preferably then, such an item could be custom designed or manufactured by any suitable flexible cable or flat flex circuit manufacturer. Although a flat flex circuit is thought to work well, alternative items can also be used instead. For example, a specially adapted ribbon cable or appropriately bundled and insulated cluster of wires can also suffice as such a flexible cable 110.

As illustrated, flexible cable 110 preferably includes various separate access locations where the printed circuits or other suitable wiring within the flexible cable can be accessed. Such access locations can comprise, in the case of a flat flex circuit for example, a grouped set of contacts that are exposed through the insulating exterior of the flat flex circuit material, such that some or all of the circuits within the flexible cable are accessible at the access point. Flexible cable 110, and in particular one or more processors that may be associated therewith, is preferably adapted to physically address each such access location, as described in greater detail below.

Such access locations are preferably spaced apart along the length of the flexible cable, with spacing between consecutive access locations being subject to variable designs. For example, such spacing can be on the order of a fraction of an inch, one inch, or several inches or more for some or all spacings between flexible cable access locations. In some embodiments, spacing between such access locations can vary, with the shortest spacing being a fraction of an inch and the longest being several inches or more. In one particular example, a flat flex circuit having sixteen access locations and variable spacings therebetween can be provided, with such variable spacings ranging from one to six inches. As will be readily appreciated, the amounts of and spacings between flexible cable access locations are simply a matter of design, and all such numbers of access locations and spacings therebetween are contemplated for use with the present invention. As will also be appreciated, the actual respective physical locations of any attachments to consecutive access locations can range from zero to the actual length of flexible cable between those attachments, due to the flexible nature of the cable.

Cable connectors 120, 121 can be coupled to the flexible cable 110 at some or all such access locations, so as to provide electrical access to the circuit lines along the flexible cable. Such cable connectors can include, for example, surface mount, through-hole and/or press-fit connectors, although one or more other suitable types of cable connectors can be used along with or instead of these connector types. As will be readily appreciated, each cable connector 120, 121 can be adapted to provide access to all circuit lines or some subset thereof, as may be appropriate for any given design. In various embodiments, such cable connectors 120, 121 can serve as "plug in" type connectors, such that buttons and/or other appropriate devices may be removably interchanged along the flexible cable via the cable connectors. Also, while some embodiments may involve a cable connector 120, 121 being installed at every access location along the flexible cable, others may involve only a subset of access locations with cable connectors being installed. In such instances, caps, covers or other suitable materials may be used to close off unused access points.

As shown in this particular example of flexibly configurable button panel 100, cable connectors 120 are preferably adapted for mating with button assemblies or switches, while cable connector 121 is preferably adapted for mating with a harness or other suitable connecting component that leads to a processing unit and/or other circuit board within the overall electronic device. As such, cable connectors 120 and 121 are preferably different in size, shape and/or electrical connections made, such that an improper button assembly, switch, harness, processor board or other component cannot be improperly plugged into the wrong cable connector. For example, while each button assembly cable connector 120 might be adapted to connect to only a subset of the circuit lines 111, processor cable connector 121 might be adapted to connect to all of the circuit lines, such that activity on every circuit line can be processed via this processor cable connector. It will be readily appreciated that other cable connector types for other components that might be included on button panel 100 might similarly be different, in the event that advanced designs might call for components other than those described herein.

Switches or button assemblies 130 can be plugged into, installed at or otherwise coupled to one or more cable connectors 120. In various embodiments, each button assembly 130 can include a button mating component 131 that is adapted to mate or otherwise interface with one or more appropriate button assembly cable connectors 120. As will be readily appreciated, not every cable connector must have an associated switch, button assembly or other component. For example, the illustrated section of flexible cable 110 includes eight cable connectors 120 for button assemblies or switches 130, but only five switches being installed, with three open and unused cable connectors. It is specifically contemplated that this five button arrangement be an acceptable and working flexibly configurable button panel 100, with the open and unused cable connectors simply being superfluous in this case. Of course, many other numbers and arrangements of total cable connectors, mating button assemblies and unused cable connectors may also be possible for any given button panel. In some embodiments, it may be desirable to cap, cover or otherwise close off unused cable connectors for a given button panel 100.

As set forth herein, all switches, button assemblies or "buttons" 130 are interconnected along the flexible cable 110 in a manner that enables the overall button panel 100 and/or other external components to physically address each button separately. Each button 130 is provided a unique address due to the circuitry design of the flexible cable 110, such that communications can be provided at each individual button as may be appropriate. Each button 130 receives communications through a communications stream, as the flexible cable 110 via its associated circuit lines 111 serves as a communications bus for all buttons coupled thereto. Of course, such communications are made between the button panel 100 and an outside source, such as a processor, which processor can be connected to the button panel via a suitable processor cable connector 121.

As shown in the illustrated example, processor harness 140 having circuit lines 141 can be coupled to flexible cable 110 via processing cable connector 121. As noted above, processor harness 140 can be used to connect the entire flexible cable 110 and thereby all switches and buttons thereupon to an externally located processor or other component within the overall electronic device. As will be appreciated, there can be a one-to-one correspondence with circuit lines 111 and 141, such that all power, communications and/or signals that are sent along flexible cable 110 are also sent along harness or other processor connector 140. In some embodiments, harness 140 may be foregone in favor of plugging or otherwise coupling a board, processing unit or other component directly to processing cable connector 121.

In some embodiments, not all button assemblies 130 need be plugged into or otherwise coupled to cable connectors 120 directly. For example, one or more button harnesses 150 may be used, whereupon the associated button assembly is thereby flexibly locatable with respect to said flexible cable itself. Such a button harness 150 can contain a number of button harness circuit lines 151, which can be in one-to-one correspondence with the connections made on button cable connector 120 and button mating component 131. Such a button harness 150 can be particularly advantageous in instances where the ordinary configurability of button panel 100 is not flexible enough for a given application. For example, a button harness might be desirable in a custom application where one or more buttons are to be placed in a remote location away from the rest of the buttons in the button panel, such as in a top box or on the side of the gaming machine. Or, it may simply be the case that the spacing for a given button panel is simply not long enough for a particular button or two, whereupon a button harness 150 can be used to provide any needed slack.

Both processor harness 140 and button harness 150 can be similar to flexible cable 110 with respect to their flexible nature and inclusion of circuit lines. Alternatively one or both types of harnesses may be of a different size, structure or even type of cable with respect to the primary flexible cable 110. As in the case of flexible cable 110, harnesses 140 and 150 can be flat flex circuits with printed circuit lines, ribbon cables, appropriately bundled and insulated clusters of wires, or any other suitable arrangement that achieves the multiple circuit connections as needed.

Figure 4:
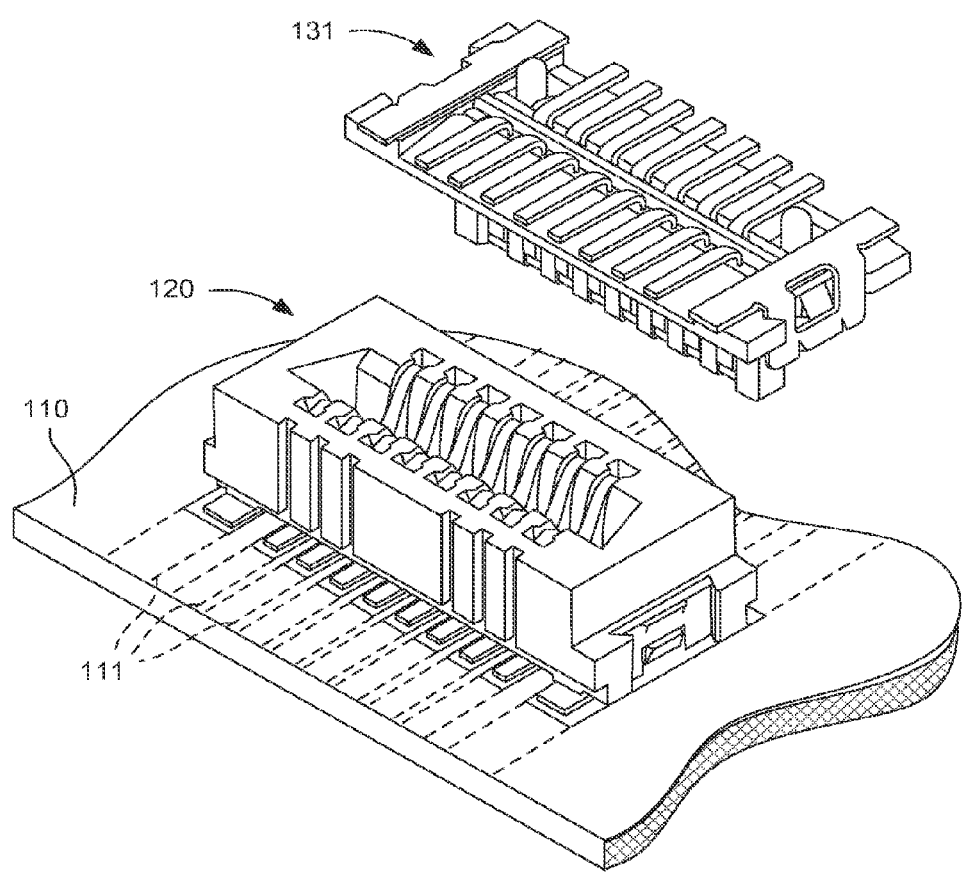
FIG. 4 illustrates in partially exploded perspective view an exemplary cable connector and button mating component according to one embodiment of the present invention.

Moving next to FIG. 4, an exemplary cable connector and button mating component are shown in partially exploded perspective view. Button cable connector 120 can be any of a variety of cable connector types, as noted above. For purposes of illustration here, cable connector 120 is a surface mount type connector. As shown, the surface mount connector used as cable connector 120 is mounted to the surface of the flexible cable 110 such that the various leads of the cable connector connect to the circuit lines 111 of the flexible cable. The cable connector 120 is preferably arranged such that a suitable button mating component 131 can be plugged into the cable connector. As will be readily appreciated, such a button mating component is preferably attached to an appropriate switch button assembly, so as to facilitate the ready installation or removal of such a switch or button assembly.

Although any number of suitable cable connectors may be used, including cable connectors other than surface mount connectors, it is thought that a 21-position Conan™ type surface mount connector is particularly suitable for such a cable connector 120. Such an item can be, for example, a vertical receptacle assembly, Part Number 91921-31121LF, as manufactured by FCI of Versailles Cedex, France. In such a specified application, button mating component 131 could then be a vertical header assembly, Part Number 91901-31121LF by the same manufacturer. In some embodiments, these same parts can be used repeatedly for all button cable connectors 120 and button mating components 131 on the button panel. Similar items having more positions so as to connect to all circuit lines can be used for the processor connector 121 and mating component from processor harness 140.

FIGS. 5A through 5D illustrate in top, side, front and partially exploded perspective views an exemplary button assembly according to one embodiment of the present invention. As will be readily appreciated, button assembly 130 may also be and/or referred to as a simple switch, button or other similar actuating component that can be included as part of button panel 100. Such a switch, button, button assembly or other suitable component can be any of a wide variety of components that can be used in conjunction with the flexible cable, cable connectors and other components of the inventive button panels disclosed herein. In fact, any of the various examples of buttons set forth in U.S. Pat. Nos. 6,102,394; 6,117,010; 6,798,359, and 7,071,845, as well as U.S. Patent Publication No. 2004/0018877, all incorporated above, can be suitably used as buttons in the present flexibly configurable button panel. Various other switches and button assemblies might also be used, and it is specifically contemplated that the present invention is not limited in any way by the number, types or models of switches or buttons that are used therewith.

In general, button assembly can include a top face 132 as part of an actuating top portion or "button" 133, a top receiving portion 134 adapted to receive the actuating button, and a non-moving lower body 135. Such a basic actuating button assembly is generally well understood within the art. While additional collars, sleeves, knobs, contacts, screws and/or other components may be present, the detailed design of such a button assembly is not critical to the overall scope of the present invention, and all such detailed button assembly designs may be used.

In various preferred embodiments, button assembly 130 can include a small display screen 136 embedded therein, which display screen can be adapted to display static images, animations and/or video on the button itself. Accordingly, top face 132 is preferably made of a clear or non-opaque material, such that the contents of display screen 136 can be seen therethrough. Again, such a display screen can be similar to that which is described for a button display screen in U.S. Pat. Nos. 6,798,359, and 7,071,845, as noted above, and other button display screen types may also be used. As one alternative to the foregoing, a more detailed display screen of, for example, 90×90 pixels may be used. As will be readily appreciated, such a small LCD type display screen for a button is typically of the type that is custom designed and manufactured, with any of a number of suitable LCD manufacturers being able to produce such screens to the desired specifications.

With the use of such a display screen, it is specifically contemplated that such a display screen enhanced button assembly also be outfitted with a small controller, logic device and/or chip or other storage device, so as to aid in the display of images, animations and/or video on the button itself. Such a logic device or small controller can be used to facilitate the display of static images, animations or video on its subject button, as will be readily appreciated. Another button feature that can be used in conjunction with or separate from a button display screen can involve the use of backlighting within the button display area. Such backlighting can be facilitated, for example, through the use of red, green and blue diode backlights (not shown), which can then be lit up in different degrees and combinations to produce a wide variety of backlight colors on the face of the button. As in the case of the display screen, such backlights can also be controlled by a small controller, logic device and/or chip installed within the button itself for display control purposes.

Figure 6A:
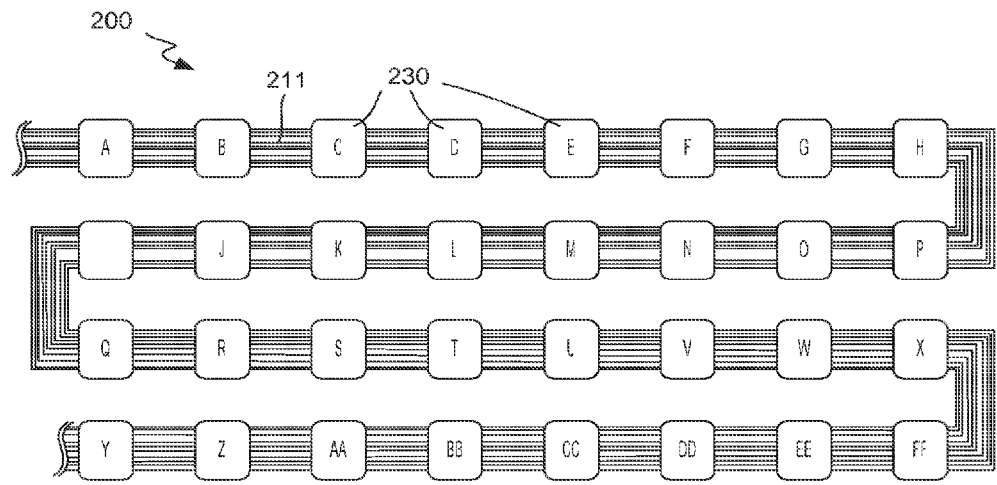
FIG. 6A illustrates a partial electrical diagram of an alternative flexibly configurable button panel according to one embodiment of the present invention.

Turning next to FIG. 6A a simple electrical diagram for an alternative flexibly configurable button panel according to one embodiment of the present invention are provided. Alternative flexibly configurable button panel 200 can be substantially similar in many regards with respect to the exemplary flexibly configurable button panel 100 described above. For example, button panel 200 can include a plurality of identical or similar circuit lines 211, and a plurality of identical or similar installed button assemblies 230. Unlike shorter button panel 100, it can be seen that longer button panel 200 can include up to 32 switches or buttons, designated here as buttons A through FF, as opposed to just the eight switches or buttons that can be used on the exemplary strip of button panel 100. Again, the number of buttons or connections for such buttons is not intended to be limited, and it is specifically contemplated that similar button panels having less or more than 32 switches, buttons or connections for such may be provided. Further, as in the example above, it is not necessary that every connector or position be filled by an actual button assembly or switch, such that various empty connectors or positions may be present.

It may be preferable in some manufacturing operations to have "short," "medium" and "long" lengths of flexibly configurable button panels, such that gaming machines requiring small, regular or particularly large amounts of buttons on a button panel can be provided with appropriate length flexible button panels. For example, it can be designated that a manufacturer keep inventory parts that include three types of flexible cable strips for all flexibly configurable button panels—an 8 button flexible cable strip, such as that shown in panel 100 above, a 15 button flexible cable strip, and a 32 button flexible cable strip, such as that shown in panel 200 here. Thus, any gaming machine having a button panel requiring connections for 1-8 buttons can be provided with the "short" length strip, any gaming machine having a button panel requiring connections for 9-15 buttons can be provided with the "medium" length strip, and any gaming machine having a button panel requiring 16-32 buttons can be provided with the "long" length strip. In the event that a given gaming machine might require more than 32 buttons for a button panel, an even longer button strip may be designed, or multiple strips of the provided lengths in inventory could be used.

Figure 6B:
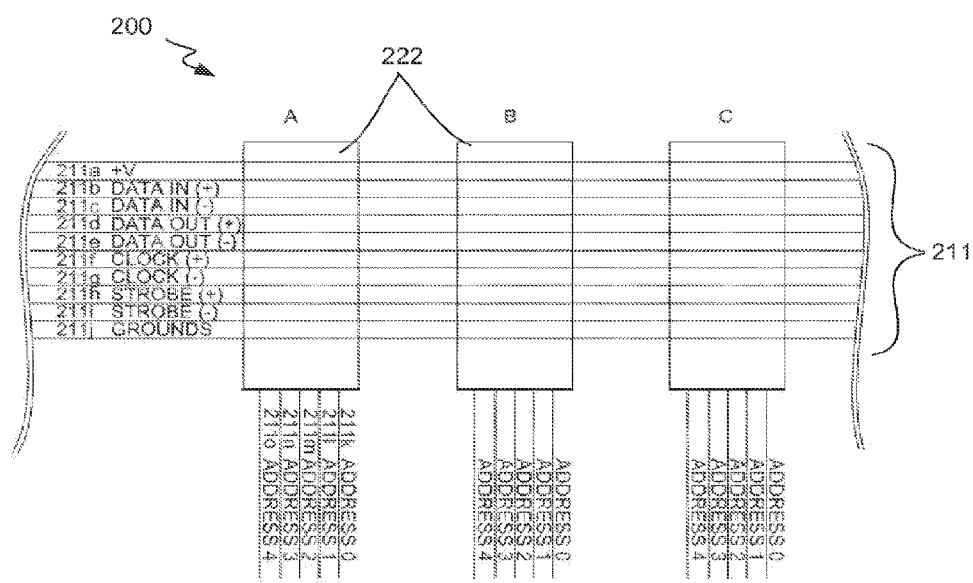
FIG. 6B illustrates a selected portion of the electrical diagram of FIG. 6A in greater detail.

Continuing on to FIG. 6B, a selected portion of the electrical diagram of FIG. 6A in shown in greater detail. In this figure, only the section of flexibly configurable button panel 200 from button positions A through C is depicted, with such positions being shown as simply access locations 222 for purposes of illustration. As will be readily appreciated, circuit lines 211 can be provided within or about a flexible cable (not shown), with some of these circuit lines being made available to all buttons (i.e., access locations) in parallel, and others being made available only to select buttons or access locations. In particular, specific address lines can be created such that only certain buttons and button positions are connected to certain address lines. As shown, the various commonly accessible circuit lines comprise lines 211a through 211j, which can include, for example, various power lines, data lines, programming lines, clock lines, strobe lines and ground lines, among others. It will be readily appreciated that more or fewer and/or different types of circuit lines may be used, as the needs of a particular design may require, and that the present example is only provided for illustrative purposes.

Figure 7:
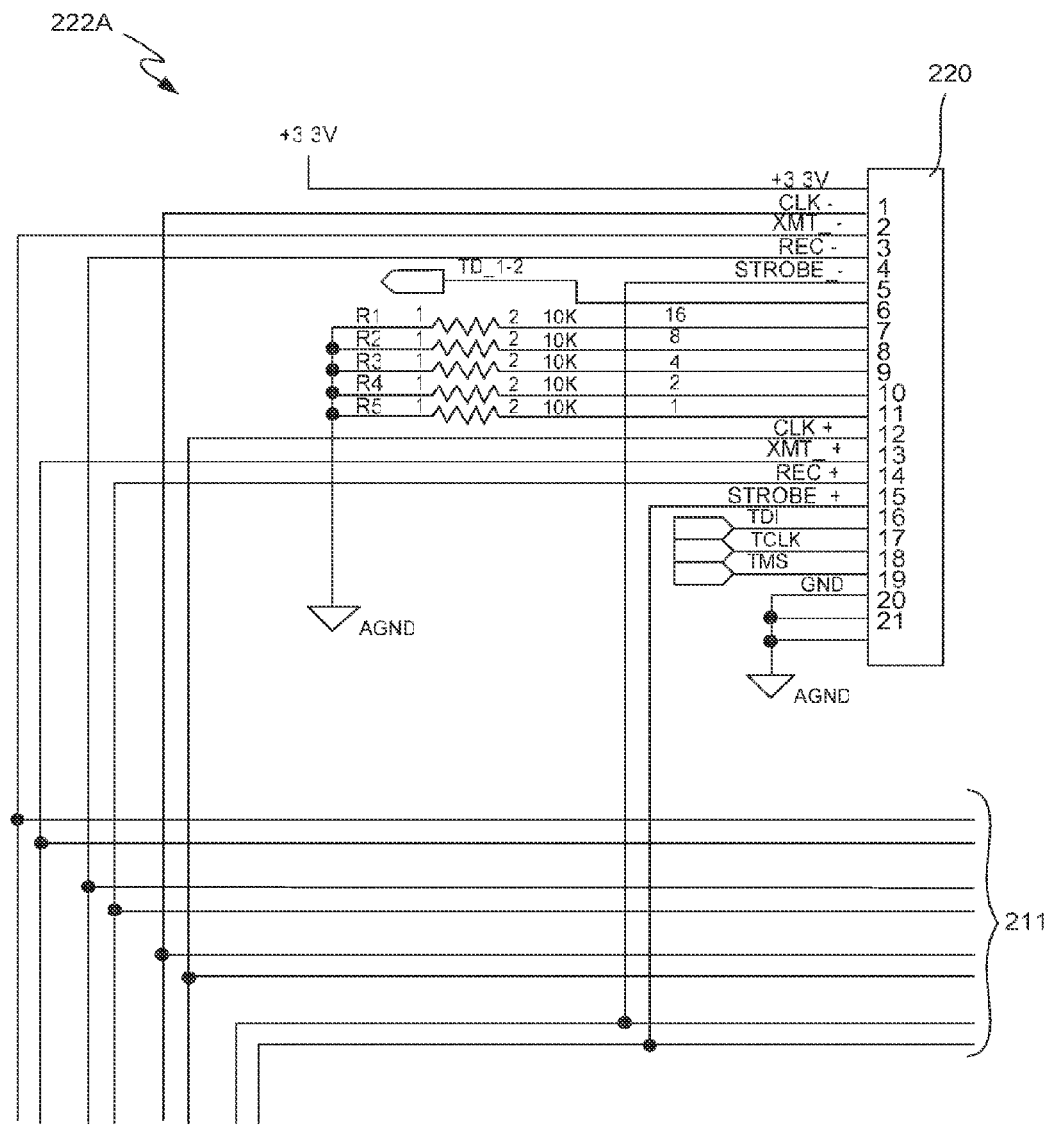
FIG. 7 illustrates an electrical diagram for an exemplary button assembly to flexible cable interface according to one embodiment of the present invention.

FIG. 7 illustrates an electrical diagram for an exemplary button assembly to flexible cable interface according to one embodiment of the present invention. Again, such an electrical schematic is presented only for illustrative purposes, and it will be readily appreciated that a wide variety of alternative electrical arrangements may be suitably used with the present invention. As shown, access location 222A can be the same access location set forth in FIG. 6B. Such an access location is wired for a 21-position cable connector 220, such as the CONAN type connector described above. As noted above with respect to FIG. 6B, the various circuit lines 211 and separate address lines connecting to the cable connector 220 can be of various types. In this particular embodiment, position 1 of cable connector 220 is designated for a power line, while positions 2 and 12 are clock lines. Positions 3 and 13 are "XMT" or transmit data lines, while positions 4 and 14 are "REC" or receive data lines. Positions 5 and 15 are strobe or synchronization lines, while positions 6 and 16-18 (i.e., TD, TDI, TCLK, TMS) are in-system programming lines. Positions 19-21 are ground lines, while positions 7-11 comprise the address lines, which are used to provide each access location with its own unique address along the flexible cable. It will be readily appreciated that the electrical layouts for each of access locations 222B, 222C and so forth are substantially similar, albeit with different properties along the set of five address lines, so as to create the unique address for each access location and thus button assembly that may be installed thereupon.

Figure 8A:
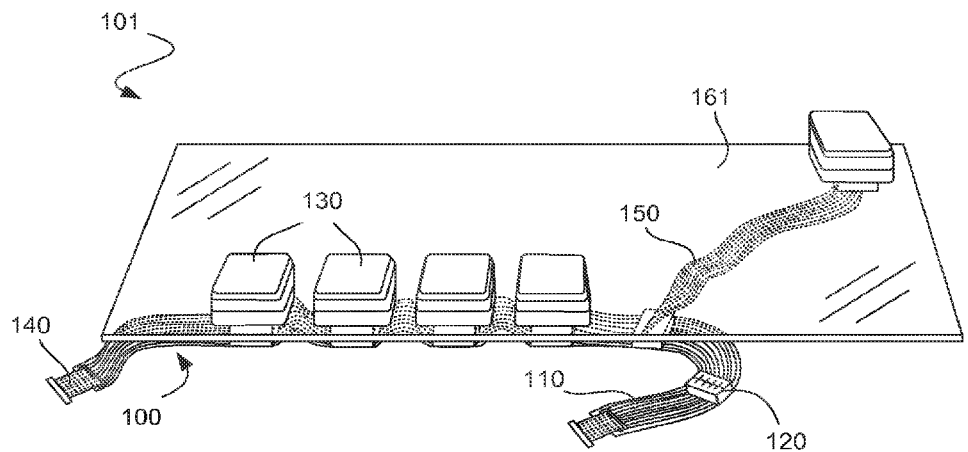
FIG. 8A illustrates in top perspective view one exemplary physical configuration of buttons for the flexibly configurable button panel of FIGS. 3A and 3B according to one embodiment of the present invention.

Moving next to FIG. 8A an exemplary physical configuration of buttons for the flexibly configurable button panel of FIGS. 3A and 3B is illustrated in top perspective view according to one embodiment of the present invention. As shown, physical button panel configuration 101 can involve an actual button configuration and installation into an appropriate electronic device, such as a gaming machine, coin-operated video game, or the like. Physical button panel configuration 101 includes the use of the previously described flexibly configurable button panel 100, having a flexible cable 110, cable connectors 120, button assemblies 130 and harnesses 140, 150. As will be readily appreciated, other different button panels might also be used to arrive at the same physical button panel configuration 101. For example, a button panel having a flexible cable with 15 button locations might also be used to achieve the same end configuration result with five used buttons. Configuration 101 results in the five buttons 130 of the flexibly configurable button panel being arranged such that the first four buttons are in an evenly spaced straight line, while the fifth button is located at some distance above and to the right of the other four buttons.

Such a resulting button configuration can be aided by the use of specific holes or locations set forth in a mounting support plate 161 or other suitable cover plate or device that can be used for locating the buttons for the button panel. Mounting support plate 161 can be included as part of a flexibly configurable button panel or electronic device having such a button panel, although such a button panel may not always require such a mounting support plate or other cover device. Such a mounting support plate can be formed from a rigid material that is sufficiently sturdy for installation into a gaming machine or other electronic device. Holes can be created within the support plate or cover device, such that the various switches, button assemblies and/or other similar components of the button panel can be located through the holes and mounted to or with respect to the mounting support plate or cover plate. In some embodiments, button assemblies can be attached directly to the mounting support plate, with the sturdy nature of the support plate then providing support for the mounted buttons. Alternatively, the plate can function simply as a cover device, with the buttons being mounted to a device frame or some other support beneath the cover plate.

Figure 8B:
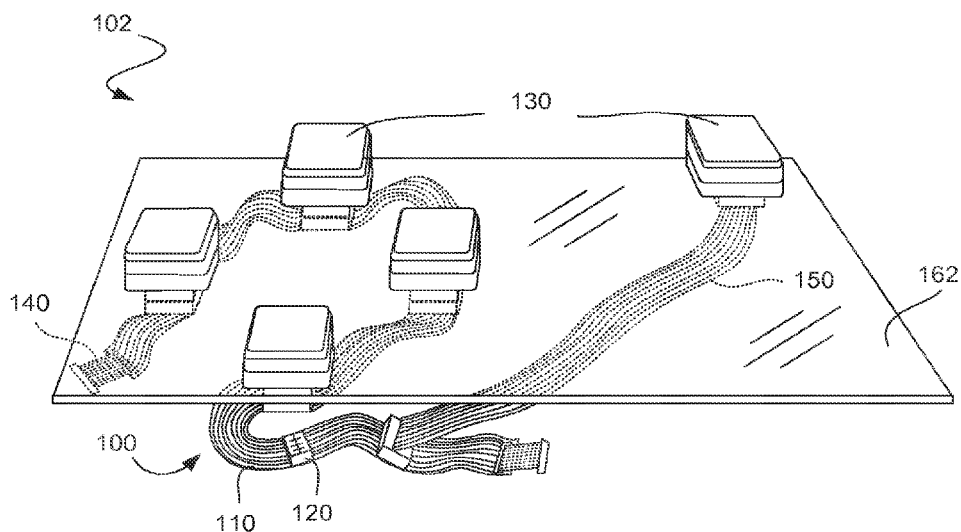
FIG. 8B illustrates in top perspective view an alternative exemplary physical configuration of buttons for the flexibly configurable button panel of FIGS. 3A and 3B according to one embodiment of the present invention.

FIG. 8B illustrates in top perspective view an alternative exemplary physical configuration of buttons for the flexibly configurable button panel of FIGS. 3A and 3B. While configuration 101 of FIG. 8A had the first four buttons of flexibly configurable button panel 100 in an evenly spaced line, alternative physical button panel configuration 102 provides that the same buttons 130 from the same button panel 100 can alternatively be arranged into a circle instead. As will be appreciated, all components from configurations 101 and 102 can be identical, with the exception of the respective mounting support plates. As such, mounting support plate 162 for configuration 102 is alternatively adapted to have holes such that the buttons 130 can be arranged in a circular formation. It is specifically contemplated that the same flexibly configurable button panel 100 from FIG. 8A could be removed from the support plate 161 and configuration 101 depicted there, and then readily installed into configuration 102 with support plate 162 as shown in FIG. 8B. Such flexibility and reconfigurability are made possible through the flexible, twistable and bendable nature of flexible cable 110, to which the buttons 130 are attached.

As will be readily appreciated, a wide variety of configurations having differing numbers of buttons can be used, and it is specifically contemplated that the flexibly configurable button panels disclosed herein can be reconfigured from one to another configuration in many such instances. For example, where a third different button configuration (not shown) having seven buttons in a triangular shape might be desired, two buttons could be added to open connectors 120 along button panel 100, and the flexible cable then readjusted such that the buttons can all align in a triangle. Although the ability to reconfigure for different numbers of buttons and relative button locations is useful, another significant application for the flexibly configurable button panels disclosed herein can be the streamlined manufacture of many such button panels for installation into different model gaming machines having different button numbers and configuration requirements. To this end, additional features such as different button panel specifications and identification numbers or codes for such specs can be useful. Dedicated button panel processors can also be particularly useful for such flexibly configurable button panels.

Figure 9:
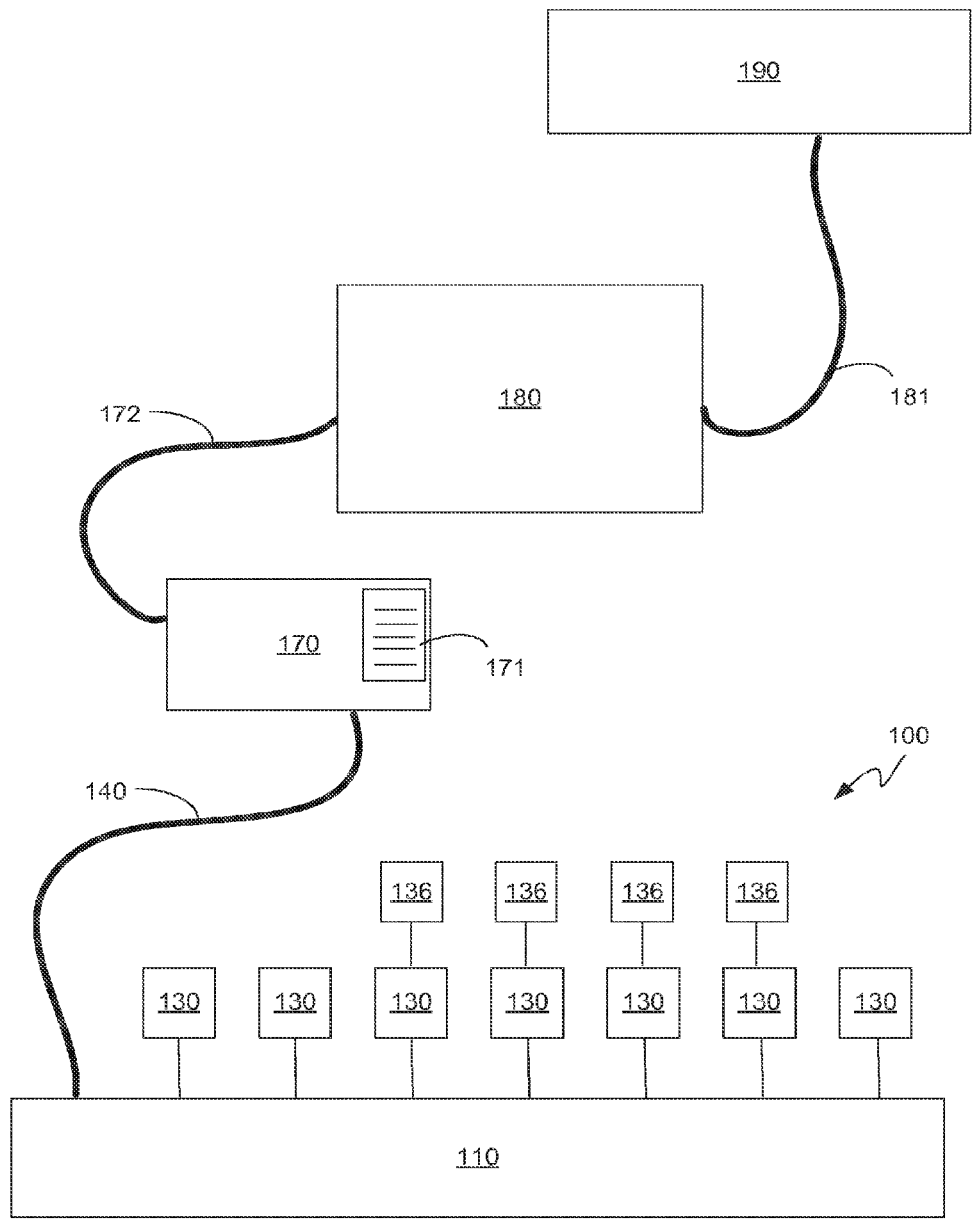
FIG. 9 illustrates a block diagram of an exemplary flexibly configurable button panel and associated processing components according to one embodiment of the present invention.

Referring now to FIG. 9, a block diagram of an exemplary flexibly configurable button panel and various associated processing components is provided according to one embodiment of the present invention. Flexibly configurable button panel 100 can be identical or substantially similar to foregoing embodiments, and as such may have a flexible cable 110 connecting a plurality of buttons 130, some or all of which may have a button display screen 136 embedded therein. A processor harness 140 can be used to connect flexible cable 110 to a button panel identification device 170, which button panel ID device may include an ID component 171 having a particular identifying number or code. The button panel ID device 170 may also be in communication with a dedicated dynamic button panel controller 180, such as by a further extending communication line 172. The dynamic button panel controller 180 may then in turn be in communication with a master gaming controller 190 of a gaming machine or other CPU type component of an alternative electronic device via communication line 181.

As will be readily appreciated, the exact general arrangement depicted herein is not intended to be limiting, and other arrangements are certainly possible. For example, it is possible to have button panel ID device 170 and/or dynamic button panel controller be disposed on a single board into which flexible cable 110 is directly plugged, such that harness 140 and a coupling communication line 172 are then unnecessary. In some embodiments, button panel ID device 170 and dynamic button panel controller 180 can be located on the same board or even on the same chipset or chip, as may be desired.

In various embodiments, button panel ID device can be used to identify the exact associated button panel 100, such as a manufacturer's serial number, although preferably such an ID number or code can correspond to a particular callout of button assemblies that should be present at specific cable connectors along the flexible cable 110. In this manner, the particular number or code on ID component 171 can be used to designate the number of buttons to be used on the button panel, the types of buttons to be used, the exact locations or addresses for such buttons on the various open connectors of the button panel, and/or the numbers and locations of open connectors to which no items should be plugged or directly coupled. The actual ID component can be any of a variety of item, such as, for example, a set of switches that can be set manually or electrically, or a small processing unit and/or memory or other storage device adapted to contain the appropriate ID number or code. In the even that manual switches are used, DIP switches are thought to work well, although other forms of manual switches may certainly be substituted.

Dynamic button panel controller 180 can be adapted to perform a number of button related functions, including, for example, the polling or checking of buttons, button diagnostics, button programming, button input processing, and video or visual image processing for button having display screens, among other pertinent functions. It is worth noting that dynamic button panel controller 180 is set apart from master gaming controller 190, such that the bulk of processing for the entire button panel 100 can be accomplished by this dedicated controller 180, thereby alleviating some of the processing burdens on the MGC, which can be particularly useful for instances where large numbers of buttons are being used. Although a variety of connection types can be used, it is thought that a universal serial bus ("USB") type connection 181 between the dynamic button panel controller 180 and MGC 190 is particularly suitable.

While dedicated dynamic button panel controller 180 is preferably adapted to process input from each of the various button assemblies 130 on the button panel 100, such a button panel controller may also be used to determine whether the number of buttons and/or configuration of buttons is proper. As noted above, button panel ID device 170 having particular ID component 171 can be used to set forth the exact number, type and arrangement of buttons along flexible cable 110. In some embodiments, button panel ID device can be a relatively "dumb" communications and power processing device, such that the actual button panel controller 180 is adapted to read the ID code from the ID component, and then poll the various button addresses to ensure that the proper component or no component is present at each such address. Alternatively, button panel ID device can be adapted to perform this function as well. Such a polling or checking function can be one that is performed during the manufacturing process, during a startup or boot process, during a diagnostics check, or at any other time as may be appropriate. In some embodiments, such a function can be used to detect broken or malfunctioning buttons during regular operations, such that an alert can be given if a problem is detected.

In addition to the foregoing functions, button panel controller 180 can also be a video or display processing device for each of the button displays 136 on the associated buttons 130. Such a processing device can be responsible not only for uploading images, animations and/or video clips to each individual button display, but can also be a storage location for holding such display items as well. Associated memory components (not shown) may be used to facilitate such a function. For this specialized functionality, controller 180 is preferably a video type processor, with a wide variety of such processors being suitable for use with the present invention. Although other brands and models may certainly be used, it is thought that the ADSP-BF534 Blackfin model processor by Analog Devices Inc., of Norwood Mass. is suitable for such a purpose. Such a processor can be used to control all desired display and other functionalities with respect to button panel 100, and in the event that multiple button panels are used in a given gaming machine or other electronic device, such multiple panels may also be controlled by such a Blackfin processor.

Dynamic Display Systems

Figure 10:
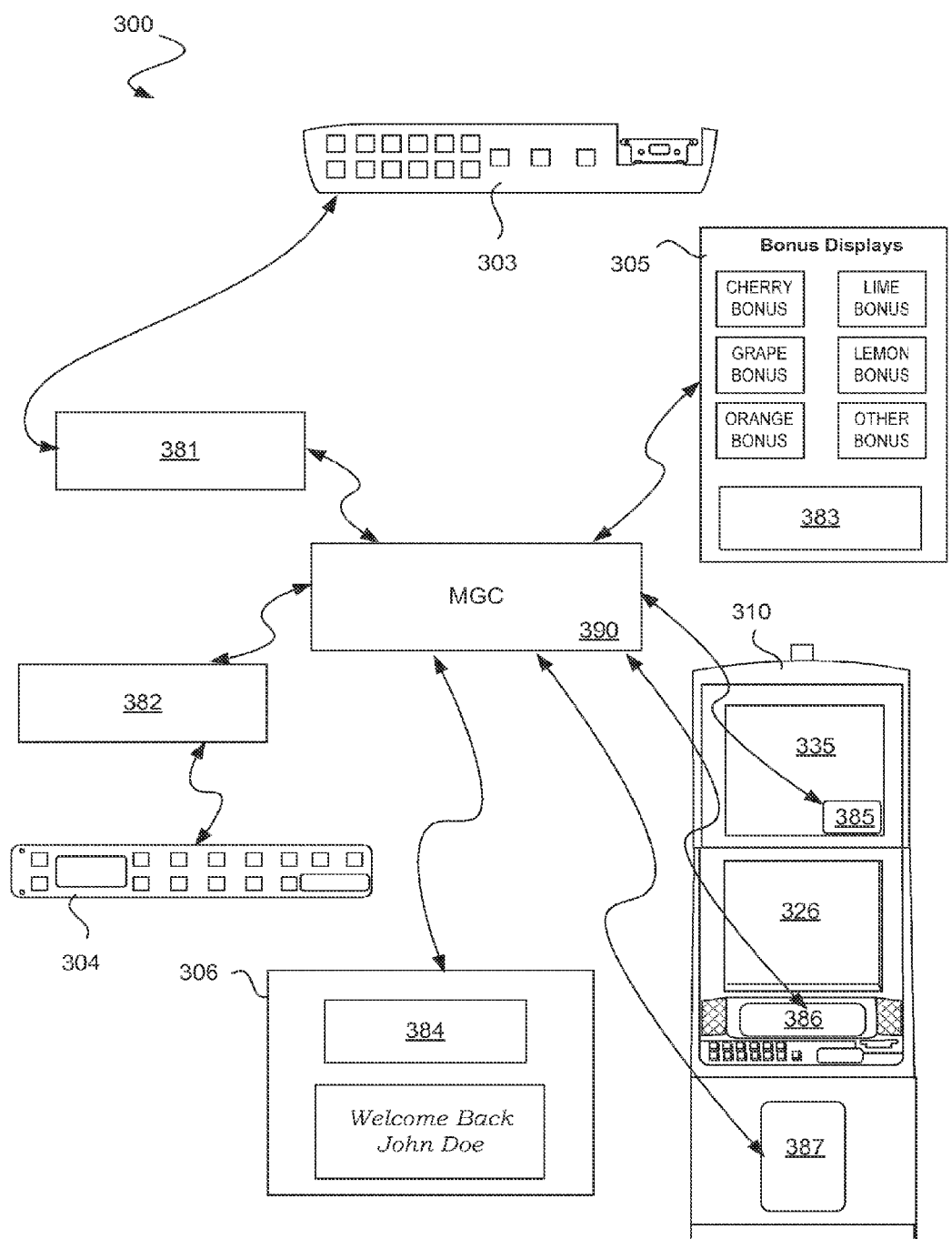
FIG. 10 illustrates a block diagram of an exemplary dynamic display system for a gaming machine having dynamic display buttons according to one embodiment of the present invention.

As described above with respect to the use of a dedicated button panel controller that can be used to control and drive the displays of various buttons, similar considerations can be made with respect to some or all displays in a gaming machine. Moving now to FIG. 10, a block diagram of an exemplary dynamic display system for a gaming machine having dynamic display buttons according to one embodiment of the present invention is provided. Several components of overall dynamic display system 300 can be identical or substantially similar to previously disclosed items. For example, gaming machine 310 can be similar to gaming machine 10, gaming machine displays 326 and 335 can be similar to displays 26 and 35, master gaming controller 390 can be similar to master gaming controller 190, flexibly configurable button panels 303 and 304 can be similar to flexibly configurable button panels 100 and 200, and dynamic button panel controllers 381 and 382 can be similar to dynamic button panel controller 180. As in the foregoing embodiments, various buttons from one or both button panels can be equipped with "dynamic displays," such that the respective dynamic button panel controller should be a display controller as well. Additional components can include other dynamic displays, such as, for example, a player tracking device with display 306, a panel of bonus displays 305, and specialized dynamic displays 385, 386 and 387 distributed about the gaming machine.

While primary gaming machine display 326 and top box display 335 may be driven and directly controlled by one or more elements within MGC 390, various other dynamic displays are preferably driven and directly controlled by display controllers that are located outside the province of MGC 390. For example, the dynamic button panel controller 381 and subject dynamic button panel 303 can be arranged as set forth above in the examples of FIG. 9, and a similar arrangement can be had for controller 382 and its subject button panel 304. Alternatively, only one dynamic button panel controller 381 might be used for both button panels 303, 304 bearing buttons with dynamic displays, with controller 382 either not being used or being included into a combination controller board with controller 381. Also, dynamic display controller 383 might be used to control the displays of a bonus dynamic display panel 305, with such a dynamic display controller being similar set apart from MGC 390. In fact, dynamic display controller 383 may even be built into bonus dynamic display panel 305, as shown. Similarly, dynamic display controller 384 can be adapted for the control of a dynamic display on a player tracking device 306, and may also be built into that device or otherwise located away from MGC 390.

Additional dynamic displays with associated dedicated dynamic display controllers may be located elsewhere on and about gaming machine 310, such as dynamic displays having built in dynamic display controllers at display windows 385 in the top box, 386 above a button panel, and 387 in the belly glass of the gaming machine, among other locations. Such dynamic displays may all be controlled directly by one or more dedicated dynamic display controllers that are separate from the MGC of the gaming machine, thereby reducing the overall display processing burdens that are typically placed upon the MGC (also sometimes called a "brain box" of the gaming machine). In some instances, such separate display controllers 381-387 can be adapted to control their respective displays in isolation, although it is preferable that there be at least some high level form of communications between the MGC and each separate display controller, such as via a USB or other suitable connection. For example, the MGC may instruct a given display controller to provide a celebration display on one or more of its display units, whereupon the display controller has the autonomy to select and process the actual type and sequence of celebration to be displayed.

In some embodiments, there can be five, ten, or even 32 or more dynamic displays, particularly where a large number of dynamic display type buttons are used, since each individual display type button can be considered a separate dynamic display. Each dynamic display can be adapted to display a variety of still or static images, animations, video clips, "attract-mode" or other default images, diagnostic images to aid in the test and repair of various machine components, and/or any combination of the foregoing items. In some embodiments, each dynamic display can also be associated with one or more dedicated memory devices or other storage units, such that various images, animations, clips and the like can be stored at the dynamic display for ready retrieval and display with minimal processing and/or downloading of display materials being needed. Alternatively, or in addition to such storage being possible at a dynamic display device, one or more of the various dynamic display controllers can be similarly adapted to have dedicated memory or storage units that have stored static visual images, animations, video clips and/or other display materials for use with one or more respectively controlled dynamic displays.

In still further embodiments, one or more of the various dynamic display controllers can be adapted to download display materials for display on its controlled display devices and/or for storage near the dynamic display controller for ready access and use at a later time. Such downloaded materials may come from MGC 390 and/or from any other suitable outside source, such as a specialized download server or other external server associated with gaming machine 310. Various arrangements for such a download server and associated gaming machines and other components distributed across a gaming network are generally known in the art, and examples of such are also provided in greater detail above with respect to FIG. 2. In some embodiments, such downloaded materials may first be provided to MGC 390, upon which the materials are then relayed to the various appropriate dynamic display controllers by the MGC, such as via USB or other suitable connections.

In this manner, the MGC can be charged with accessing downloaded materials from a remote server and then distributing them to the various dynamic display controllers as may be appropriate, without then being further burdened by any display processing that may be incumbent upon the use of such downloaded materials. Although there are countless examples of how such applications might be implemented for any given gaming machine or system, a particular example might involve the use of downloadable games and the different displays that are to be used for the various button displays from game to game. For example, a card based game existing on gaming machine 310 may call for buttons labeled "hold," "drop," "deal," "bet" and "redraw," among others. When a player or casino personnel might then elect to download a reel based game to gaming machine 310, the labels for some or all of these buttons might need to be changed and/or blacked out, in the event that fewer buttons are to be used with the new reel based game. In such an instance, the MGC 390 might request the new downloaded game and a host of associated images and other applications, which could include new button labels. Such new button labels might include, for example, "spin," "respin," "nudge," and "bonus bet," among others. Upon receiving the display images for these new button labels, the MGC could then simply pass these display images along to the responsible dynamic display controller 381, where such display images are then stored locally and/or provided to the individual buttons for display in association with the new game.

As in the case of controllers 381 and 382 being combined into one control unit for two button panels, it is also contemplated that any particular dynamic display controller be adapted to control dynamic displays on disparate devices. For example, the same controller might be used to control dynamic displays on a button panel and a player tracking device, as well as a belly glass dynamic display. In such instances where multi-functional dynamic display controllers are used, it is also preferable that such controllers also be adapted to perform diagnostics checks and be able to detect which kinds of devices with which the display controller is communicating. For example, if dynamic display controller 382 were removed, belly glass dynamic display 387 did not have a built in display controller, and both button panel 304 and belly glass dynamic display 387 were connected to dynamic display controller 381, such controller 381 is preferably adapted to poll both new devices to determine their device type and whether controller 381 is able to support the needs of these disparate display devices. Again, it is thought that a Blackfin type display controller device can be used for such applications.

Method of Manufacture

It will be readily appreciated that the various methods and illustrative flowcharts provided herein are merely exemplary, and that the present invention may be practiced in a wide variety of suitable ways. While the provided flowcharts may be comprehensive in some respects, it will be readily understood that not every step provided is necessary, that other steps can be included, and that the order of steps might be rearranged as desired by a given manufacturer, as desired.

Figure 11:
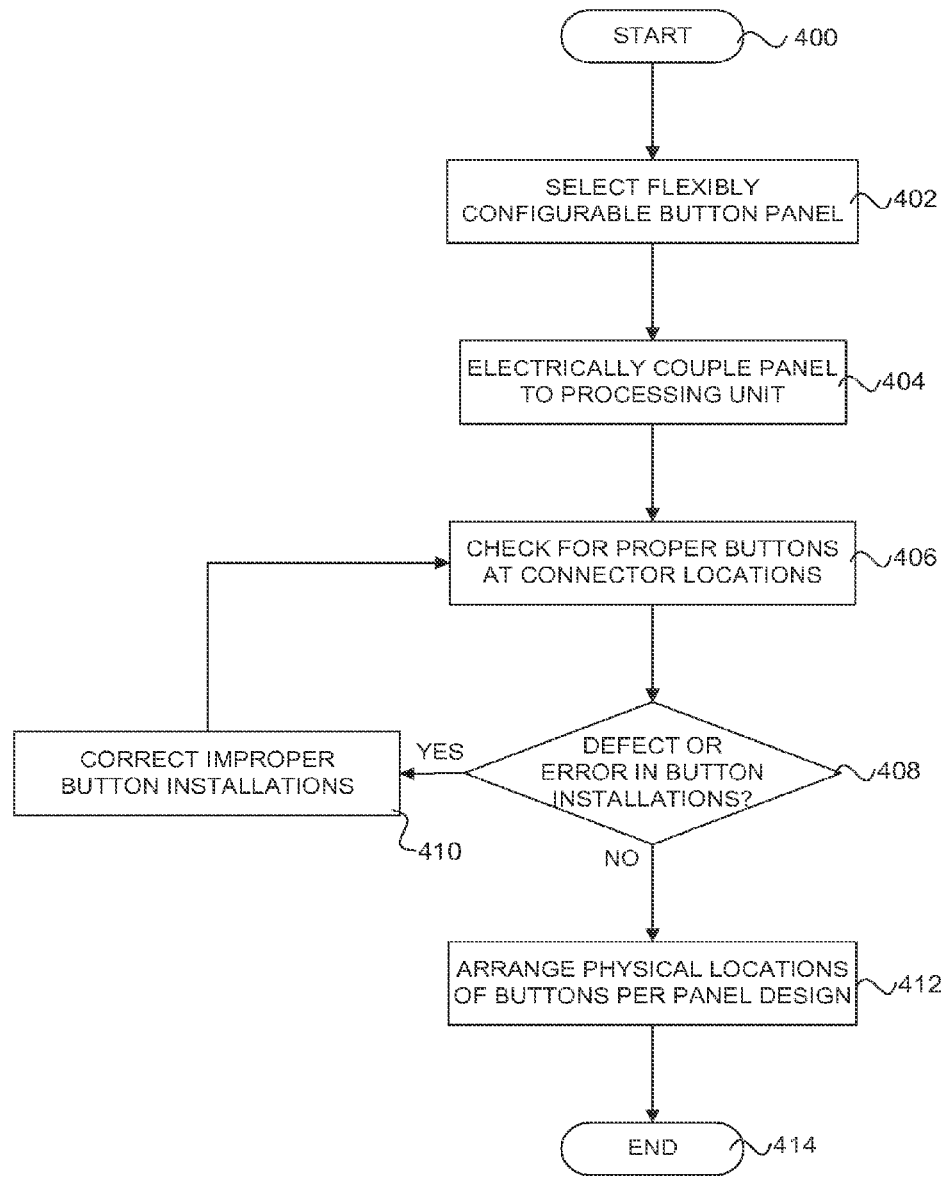
FIG. 11 illustrates a flowchart of an exemplary method of manufacturing an electronic device having a flexibly configurable button panel according to one embodiment of the present invention.

FIG. 11 shows a flowchart illustrating an exemplary method of manufacturing an electronic device using a flexibly configurable button panel. In particular, after start step 400, a first process step 402 involves selecting a flexibly configurable button panel. Such a button panel can be, for example, any of the exemplary flexibly configurable button panels as described above, such as button panel 100, for instance. Process step 404 then involves electrically coupling the selected button panel to a processing unit for the electronic device. Such a processing unit could be, for example, a dynamic button panel controller, a button panel ID device, a master gaming controller, or any other suitable controller adapted for interaction with the flexible button panel. The method then continues to process step 406, where a check is made for the proper buttons, other devices and/or appropriate lack thereof being installed on the button panel in general, as well such buttons and/or devices being installed as at the proper locations or addresses along the button panel, as described above in greater detail. Such a check can also determine whether the installed buttons are functioning properly, as may be desired.

At a subsequent decision step 408, an inquiry is made as to whether there are any defective, missing or otherwise improperly installed buttons or other devices on the button panel. If so, then the method moves to process step 410, where the improper button installations and/or defective buttons can be corrected. From step 410, the method can then revert back to step 406, such that further checks can be made until there are no defects or errors in the button installations along the flexibly configurable button panel. In the event that there are indeed no such defects or errors, then the method continues to process step 412, where the physical locations of the various buttons and/or other items can be arranged with respect to each other according to a pre-designed panel configuration. Examples of such arrangements and designs are provided above in FIGS. 8A and 8B, along with the descriptions thereto. With respect to step 412, a mounting support plate may be used if desired. After the physical locations of the buttons are arranged at step 412, the method then finishes at end step 414. Of course, additional steps may also apply to such a manufacturing process, such as for example, plugging in or coupling individual buttons to the button panel, setting a panel ID either manually or electronically, and designing the actual button panel configuration or arrangement as it is to be installed.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A gaming machine comprising:
   an exterior housing arranged to contain a plurality of internal gaming machine components therein;
   a master gaming controller in communication with at least one of said plurality of internal gaming machine components and configured to execute or control one or more aspects of a wager based game; and
   a button panel in communication with said master gaming controller and configured to provide a plurality of input buttons, the button panel including:
   a cable having a plurality of printed circuit lines running therethrough,
   a plurality of button assemblies configured to have electrical access to at least a portion of said printed circuit lines, and
   a plurality of cable connectors coupled to said cable and configured to be coupled to the plurality of button assemblies, wherein the plurality of cable connectors are configured to provide addressing for the plurality of button assemblies, the addressing providing communication between the master gaming controller and the plurality of button assemblies.

2. The gaming machine of claim 1, wherein at least one of said plurality of button assemblies is configured to be removably coupled to a respective cable connector.

3. The gaming machine of claim 1, wherein at least one of said plurality of cable connectors is configured to provide electrical access to every active circuit line within said cable for purposes of communications with one or more processors external to said button panel.

4. The gaming machine of claim 1, wherein said plurality of printed circuit lines include one or more lines selected from each of the categories consisting of data, programming, clock, strobe, power, ground and address lines.

5. The gaming machine of claim 1, further comprising:
a dedicated dynamic button panel controller coupled to said cable via a respective cable connector, said dedicated dynamic button panel controller being configured to process input from each of said plurality of button assemblies.

6. The gaming machine of claim 5, further comprising:
a button panel identification device, said button panel identification device having a number or code that corresponds to a particular callout of button assemblies that should be present at specific cable connectors selected from said plurality of cable connectors.

7. The gaming machine of claim 6, wherein at least one of said dedicated dynamic button panel controller and said button panel identification device is configured to check each of said plurality of cable connectors for the appropriate presence or absence of a button assembly according to said specific button panel identification number or code.

8. The gaming machine of claim 7, further comprising:
a set of switches, wherein said specific button panel identification number or code is provided as a result of the setting of said set of manually settable switches.

9. The gaming machine of claim 1, wherein one or more of said plurality of cable connectors are selected from the group consisting of surface mount connectors, through-hole connectors and press-fit connectors.

10. A button panel adapted to provide a plurality of input buttons, said button panel comprising:
a cable having a plurality of printed circuit lines running therethrough,
a plurality of button assemblies configured to have electrical access to at least a portion of said printed circuit lines, and
a plurality of cable connectors coupled to said cable and configured to be coupled to the plurality of button assemblies, wherein the plurality of cable connectors are configured to provide addressing for the plurality of button assemblies, the addressing providing communication between the master gaming controller and the plurality of button assemblies.

11. The button panel of claim 10, wherein at least one of said plurality of button assemblies is configured to be removably coupled to a respective cable connector.

12. The button panel of claim 10, wherein at least one of said plurality of cable connectors is configured to provide electrical access to every active circuit line within said cable for communication with one or more processors external to said button panel.

13. The button panel of claim 10, wherein said plurality of printed circuit lines include one or more lines selected from each of the categories consisting of data, programming, clock, strobe, power, ground and address lines.

14. The button panel of claim 10, wherein the button panel is in communication with a dedicated dynamic button panel controller coupled to said cable via a respective cable connector, said dedicated dynamic button panel controller being configured to process input from each of said plurality of button assemblies.

15. The button panel of claim 14, further comprising:
a button panel identification device, said button panel identification device having a number or code that corresponds to a particular callout of button assemblies that should be present at specific cable connectors selected from said plurality of cable connectors.

16. The button panel of claim 15, wherein said button panel identification device is configured to check each of said plurality of cable connectors for the appropriate presence or absence of a button assembly according to said specific button panel identification number or code.

17. The button panel of claim 10, wherein one or more of said plurality of cable connectors are selected from the group consisting of surface mount connectors, through-hole connectors and press-fit connectors.

18. A method of manufacturing an electronic device having user input buttons, comprising:
selecting a button panel having a cable with a plurality of circuit lines running therethrough, wherein a plurality of cable connectors are coupled to said cable and provide addressing for a plurality of button assemblies, wherein the plurality of button assemblies is coupled to the cable connectors, and wherein the plurality of button assemblies is provided electrical access to at least a portion of said plurality of printed circuit lines;
electrically coupling said button panel to a processing unit associated with said electronic device, said processing unit being configured to process input from said plurality of button assemblies; and
arranging the relative physical locations of said plurality of button assemblies with respect to each other to form a specific button panel configuration in accordance with a pre-designed button panel configuration for said electronic device while said plurality of button assemblies remain coupled to said cable via said respective portion of cable connectors.

19. The method of claim 18, further comprising:
checking whether said plurality of button assemblies are correctly located at their respective plurality of cable connectors in accordance with said pre-designed button panel configuration.

20. The method of claim 19, wherein the checking is performed in accordance with a number or code present on a button panel identification device associated with said button panel.

* * * * *